(12) United States Patent
Li et al.

(10) Patent No.: US 11,494,019 B2
(45) Date of Patent: Nov. 8, 2022

(54) TOUCH DISPLAY DEVICE, TOUCH DISPLAY PANEL AND MANUFACTURING METHOD THEREOF

(71) Applicants: Chongqing BOE Display Technology Co., Ltd., Chongqing (CN); BOE TECHNOLOGY GROUP CO., LTD., Beijing (CN)

(72) Inventors: Shuanzhu Li, Beijing (CN); Weixin Meng, Beijing (CN); Yucheng Chan, Beijing (CN); Xiangquan Zheng, Beijing (CN); Kewen Zeng, Beijing (CN); Jonguk Kwak, Beijing (CN)

(73) Assignees: CHONGQING BOE DISPLAY TECHNOLOGY CO., LTD., Chongqing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/331,854

(22) Filed: May 27, 2021

(65) Prior Publication Data
US 2022/0100302 A1    Mar. 31, 2022

(30) Foreign Application Priority Data
Sep. 27, 2020   (CN) .......................... 202011033733.7

(51) Int. Cl.
| G09G 5/00 | (2006.01) |
| G06F 3/041 | (2006.01) |
| G06F 3/044 | (2006.01) |
| H01L 27/32 | (2006.01) |
| H01L 51/52 | (2006.01) |
| H01L 51/56 | (2006.01) |

(52) U.S. Cl.
CPC .......... *G06F 3/0412* (2013.01); *G06F 3/0445* (2019.05); *H01L 27/323* (2013.01); *H01L 27/3246* (2013.01); *H01L 51/5253* (2013.01); *H01L 51/56* (2013.01); *G06F 2203/04103* (2013.01); *G06F 2203/04111* (2013.01)

(58) Field of Classification Search
CPC ................. G06F 3/0412; G06F 3/0445; G06F 2203/04103; G06F 2203/04111; H01L 27/323; H01L 27/3246; H01L 51/5253; H01L 51/56
USPC ........................................................ 345/173
See application file for complete search history.

(56) References Cited

U.S. PATENT DOCUMENTS

| 2020/0357869 | A1* | 11/2020 | Choi | ................. | H01L 27/3246 |
| 2021/0265600 | A1* | 8/2021 | Lee | ..................... | H01L 51/5284 |
| 2021/0408444 | A1* | 12/2021 | Ouyang | .............. | H01L 27/3234 |
| 2022/0052281 | A1* | 2/2022 | Fang | ..................... | H01L 51/524 |

* cited by examiner

*Primary Examiner* — Jennifer T Nguyen
(74) *Attorney, Agent, or Firm* — Xsensus LLP

(57) ABSTRACT

The present disclosure relates to a method for manufacturing a touch display panel. The method includes providing a substrate film layer; forming a display functional film layer on the substrate film layer; forming an encapsulation film layer on a side of the display functional film layer away from the substrate film layer; forming a touch functional film layer on a side of the encapsulation film layer away from the display functional film layer; and after the touch functional film layer is formed, removing all film layers which include at least the substrate film layer and are located at opening areas to form through holes.

12 Claims, 13 Drawing Sheets

TOUCH DISPLAY DEVICE, TOUCH DISPLAY PANEL AND MANUFACTURING METHOD THEREOF

CROSS-REFERENCE TO RELATED APPLICATION

This application is based upon, and claims the benefit of and priority to, Chinese Application No. 202011033733.7, filed Sep. 27, 2020, the entire contents of which are incorporated herein by reference.

TECHNICAL FIELD

The present disclosure relates to display technologies and, in particular, to a touch display device, a touch display panel, and a method for manufacturing the touch display panel.

BACKGROUND

Organic Electro Luminescent Display (OLED) has gradually become the mainstream of the display field due to its low power consumption, high color saturation, wide viewing angle, thin thickness, flexibility, and other excellent performance. OLED can be widely used terminal products, such as smart phones, tablet computers, or TVs. In various OLEDs, flexible OLED products are the most prominent, and gradually become the mainstream of OLED displays because they can meet various special structures.

With the development of flexible technologies, flexible displays have been developed from bendable displays to foldable displays, and gradually transition to stretchable displays. Flexible and stretchable displays have received extensive attention from the market due to their wide applications. However, the flexible and stretchable displays also face many technical challenges.

It should be noted that the information disclosed in the Background section above is only for enhancing the understanding of the background of the present disclosure, and thus may include information that does not constitute prior art known to those of ordinary skill in the art.

SUMMARY

Embodiments of the present disclosure provide a touch display device, a touch display panel, and a method for manufacturing the touch display panel.

According to an aspect of the present disclosure, there is provided a method for manufacturing a touch display panel. The touch display panel includes a plurality of island areas, opening areas located between adjacent ones of the plurality of island areas, and bridge areas for connecting adjacent ones of the plurality of island areas;

wherein the method includes:

providing a substrate film layer, the substrate film layer being located in the island areas, the opening areas, and the bridge areas;

forming a display functional film layer on the substrate film layer, the display functional film layer being located at least in the island areas and the bridge areas;

forming an encapsulation film layer on a side of the display functional film layer away from the substrate film layer, the encapsulation film layer being located at least in the island areas and the bridge areas;

forming a touch functional film layer on a side of the encapsulation film layer away from the display functional film layer, the touch functional film layer being located at least in the island areas and the bridge areas; and after the touch functional film layer is formed, patterning all film layers which include at least the substrate film layer and are located at the opening areas by using a patterning process to form through holes.

According to an exemplary embodiment of the present disclosure, forming the display functional film layer on the substrate film layer includes at least:

forming a first metal layer on the substrate film layer, the first metal layer including at least a source electrode and a drain electrode located in each of the island areas;

forming a first passivation layer on a side of the first metal layer away from the substrate film layer, wherein the first passivation layer is located in the island areas and the bridge areas, the first passivation layer has a sixth hollow hole located in each opening area, and a boundary of the sixth hollow hole coincides with a boundary of each opening area;

forming a first planarization layer on a side of the first passivation layer away from the first metal layer, wherein the first planarization layer is located in the island areas and the bridge areas, the first planarization layer has a first hollow hole within which the boundary of the opening area is located, and the first hollow hole exposes the first passivation layer;

forming a second passivation layer on a side of the first planarization layer away from the first passivation layer, wherein the second passivation layer is located in the island areas and the bridge areas and is in contact with the first passivation layer through the first hollow hole, the second passivation layer has a seventh hollow hole located in each opening area and whose boundary coincides with a boundary of the opening area, a first hole located in each island areas and close to the opening area and a second hole located in each bridge area and close to the opening area.

According to an exemplary embodiment of the present disclosure, the first passivation layer further has a third through hole and a fourth through hole which are located in the island areas and are provided in a same layer as the sixth hollow hole;

the first planarization layer further has a fifth through hole and a sixth through hole located in the island areas and provided in a same layer as the first hollow hole, a boundary of the fifth through hole coincides with a boundary of the third through hole, and a boundary of the sixth through hole coincides with a boundary of the fourth through hole;

wherein after forming the first planarization layer and before forming the second passivation layer, forming the display functional film layer on the substrate film layer further includes:

forming a second metal layer on a side of the first planarization layer away from the first passivation layer, wherein the second metal layer includes at least a first transfer electrode and a second transfer electrode located in each of the island areas, the first transfer electrode is in contact with the drain electrode through the fifth through hole and the third through hole, and the second transfer electrode is in contact with the source electrode through the sixth through hole and the fourth through hole; and forming a second planarization layer on a side of the second metal layer away from the first planarization layer, wherein the second planarization layer is located in the island areas and the bridge areas, the second planarization layer has a second hollow hole in which a boundary of the opening area is located and a seventh through hole, the second hollow hole is aligned with the first hollow hole, and the seventh through hole exposes a part of the first transfer electrode;

wherein the second passivation layer is in contact with the first passivation layer through the second hollow hole and the first hollow hole.

According to an exemplary embodiment of the present disclosure, after forming the seventh hollow hole, the first hole and the second hole on the second passivation layer, forming the display functional film layer on the substrate film layer further includes:

patterning parts of the second planarization layer corresponding to the first hole and the second hole, so that a first isolation groove communicating with the first hole and a second isolation groove communicating with the second hole are formed in the second planarization layer, wherein a depth of each of the first isolation groove and the second isolation groove is smaller than a thickness of the second planarization layer; and patterning a central part of the second passivation layer that is located at a side of the first hole away from the opening area to form a central hole exposing the second planarization layer.

According to an exemplary embodiment of the present disclosure, after the central hole is formed in the second passivation layer, forming the display functional film layer on the substrate film layer further includes:

forming an anode on the second planarization layer corresponding to the central hole, wherein the anode is in contact with the first transfer electrode through the seventh through hole;

on a side of the anode away from the second planarization layer, forming a pixel define layer in the island areas, wherein the pixel define layer has a pixel opening exposing at least part of the anode, and the pixel define layer covers a part of the second passivation layer between the central hole and the first hole;

on a side of the pixel define layer away from the anode, sequentially forming a spacer and an organic light-emitting layer in the island areas, wherein an orthographic projection of the spacer on the substrate film layer is located in an orthographic projection of the pixel define layer on the substrate film layer, and the organic light-emitting layer is at least located in the pixel opening and in contact with the anode; and forming a cathode on a side of the organic light-emitting layer away from the anode, wherein the cathode is located in the island areas, the bridge areas, and the opening areas, and the cathode is discontinuous at the first isolation groove, the second isolation groove and each opening area.

According to an exemplary embodiment of the present disclosure, forming the encapsulation film layer on the side of the display functional film layer away from the substrate film layer includes:

forming an inorganic encapsulation layer on a side of the cathode away from the organic light-emitting layer, wherein the inorganic encapsulation layer is located in the island areas, the bridge areas, and the opening areas, and the inorganic encapsulation layer is filled in the first isolation groove, the first hole, the second isolation groove, and the second hole;

forming an organic encapsulation layer on a side of the inorganic encapsulation layer away from the cathode, wherein the organic encapsulation layer is located in the island areas and the bridge areas, the organic encapsulation layer has a third hollow hole located in each opening area, and a boundary of the third hollow hole coincides with the boundary of the opening area.

According to an exemplary embodiment of the present disclosure, forming the touch functional film layer on the side of the encapsulation film layer away from the display functional film layer includes:

forming a second buffer layer on a side of the organic encapsulation layer away from the inorganic encapsulation layer, wherein the second buffer layer is located in the island areas, the bridge areas, and the opening areas;

forming a conductive layer on a side of the second buffer layer away from the organic encapsulation layer, wherein the conductive layer include a plurality of first conductive bridges at least located in the island areas;

forming a touch insulating layer on a side of the conductive layer away from the second buffer layer, wherein the touch insulating layer is located in the island areas and the bridge areas, the touch insulating layer has an eighth hollow hole in each opening area and a plurality of third holes located in each island areas, a boundary of the eighth hollow hole coincides with the boundary of the opening area, and the third hole exposes a part of the first conductive bridge;

forming a touch electrode layer on a side of the touch insulating layer away from the conductive layer, wherein the touch electrode layer includes a plurality of first touch electrodes, second touch electrodes, and conductive bridges at least located in the island areas, adjacent first touch electrodes are in contact with a same first conductive bridge through one of the third holes, adjacent second touch electrodes are in contact through the second conductive bridge, and the first touch electrode and the second touch electrode are insulated from each other; and forming an organic protective layer on a side of the touch electrode layer away from the touch insulating layer, wherein the organic protective layer is located in the island areas and the bridge areas, and the organic protective layer has a fourth hollow hole located in each opening area, and a boundary of the fourth hollow hole coincides with the boundary of the opening area.

According to an exemplary embodiment of the present disclosure, the organic encapsulation layer and the organic protective layer are optical adhesive layers.

According to an exemplary embodiment of the present disclosure, after the touch functional film layer is formed, patterning all film layers which include at least the substrate film layer and are located at the opening area by using the patterning process to form the through hole, includes:

forming a hard mask on a side of the organic protective layer away from the touch electrode layer, wherein the hard mask is located in the island areas and the bridge areas, the hard mask has a fifth hollow hole located in each opening area, and a boundary of the fifth hollow hole coincides with the boundary of the opening area;

patterning all the film layers which include at least the second buffer layer, the inorganic the inorganic encapsulation layer, the cathode, and the substrate film layer and are located at the opening area by using the patterning process to form the through holes; and removing the hard mask on the organic protective layer.

According to an exemplary embodiment of the present disclosure, a material of the hard mask is indium zinc oxide.

According to an exemplary embodiment of the present disclosure, before the first metal layer is formed on the substrate film layer, forming the display functional layer on the substrate film layer further include:

forming a first buffer layer on the substrate film layer, wherein the first buffer layer is located in the island areas, the bridge areas, and the opening areas;

forming an active layer on a side of the first buffer layer away from the substrate film layer, wherein the active layer is located in the island areas;

forming a first gate insulating layer on a side of the active layer away from the first buffer layer, wherein the first gate insulating layer is located in the island areas, the bridge areas, and the opening areas;

forming a third metal layer on a side of the first gate insulating layer away from the active layer, wherein the third metal layer at least includes a gate electrode located in each of the island areas;

forming a second gate insulating layer on a side of the third metal layer away from the first gate insulating layer, wherein the second gate insulating layer is located in the island areas, the bridge areas, and the opening areas;

forming an interlayer dielectric layer on a side of the second gate insulating layer away from the third metal layer, wherein the interlayer dielectric layer is located in the island areas, the bridge areas, and the opening areas; and patterning the interlayer dielectric layer, the second gate insulating layer, and the first gate insulating layer to form the first through hole and the second through hole located in the island areas and a ninth hollow hole located in each opening area, wherein the first through hole exposes one end of the active layer, the second through hole exposes the other end of the active layer, and a boundary of the ninth hollow hole coincides with the boundary of the opening area and the ninth hollow hole exposes the first buffer layer;

wherein the drain electrode is in contact with one end of the active layer through the first through hole, and the source electrode is in contact with the other end of the active layer through the second through hole.

According to another aspect of the present disclosure, there is provided a touch display panel manufactured using the manufacturing method of the touch display panel as described above.

According to another aspect of the present disclosure, there is provided a touch display device, including a cover plate and the touch display panel described above. A side of the touch functional film layer of the touch display panel away from the substrate film layer is attached to the cover plate.

It should be understood that the above general description and the following detailed description are only exemplary and explanatory, and should not be considered as constituting any limitations on the present disclosure.

BRIEF DESCRIPTION OF THE DRAWINGS

The drawings, which are incorporated into the specification and constitute a part of the specification, show embodiments in accordance with the disclosure, and are used to explain the principles of the disclosure together with the specification. Understandably, the drawings in the following description are only some embodiments of the present disclosure. For those of ordinary skill in the art, other drawings can be obtained based on these drawings without creative work.

DETAILED DESCRIPTION

Figure 1:
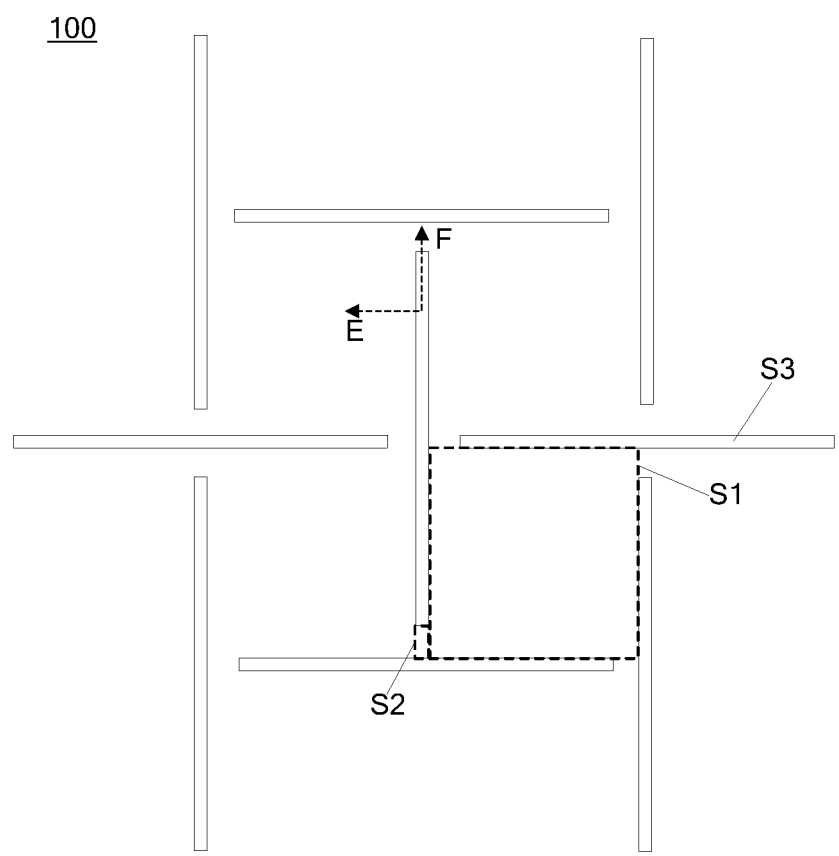
FIG. 1 shows a schematic diagram of a top view structure of a touch display panel according to an embodiment of the present disclosure.

The technical solutions of the present disclosure will be described in detail with reference to drawings. In the specification, the same or similar reference numerals indicate the same or similar components. The following description of the embodiments of the present disclosure with reference to the accompanying drawings is intended to explain the general inventive concept of the present disclosure, and should not be construed as a limitation to the present disclosure.

In addition, in the following detailed descriptions, for the convenience of explanation, many specific details are set forth to provide a comprehensive understanding of the embodiments of the present disclosure. However, one or more embodiments can also be implemented without these specific details.

Unless otherwise defined, the technical terms or scientific terms used in the present disclosure shall have the usual meanings understood by those with ordinary skills in this art. The "first", "second", and similar words used in the present disclosure do not indicate any order, quantity, or importance, but are only used to distinguish different components. The words "include" or "comprise," and other similar words used in the present disclosure, mean that an element or item appearing before the word covers an element or item listed after the word and their equivalents, but does not exclude other elements or items. Words such as "connected" or "in connection" used in the present disclosure are not limited to physical or mechanical connections, but may include electrical connections, whether direct or indirect. The words "up", "down", "left", "right", and so on used in the present disclosure are only used to indicate the relative position relationship. When the absolute position of a described object changes, the relative position relationship may also change accordingly. As used in the present disclosure, "on", "formed on", and "arranged on" can mean that one layer is directly formed or arranged on another layer, or that a layer is formed or arranged indirectly on another layer, that is, there may be other layers between the two layers. As used herein, "A formed on a side of B away from . . . " can mean "A is formed after B . . . ".

In addition, in the present disclosure, unless otherwise specified, the term "arranged/provided on a same layer" means that two layers, parts, members, elements, or components can be formed by the same patterning process, and the two layers, parts, members, elements, or components are generally formed of the same material.

In the present disclosure, unless otherwise specified, the expression "patterning process" generally includes steps of photoresist coating, exposure, development, etching, and photoresist stripping, and so on. The expression "one patterning process" means a process of forming patterned layers, parts, components, and so on using one mask.

In order to keep the following description of the embodiments of the present disclosure clear and concise, the present disclosure omits detailed descriptions of some known functions and known components. As shown in FIG. 1, an embodiment of the present disclosure provides a touch display panel 100. The touch display panel 100 may include a plurality of island areas S1, an opening area S3 located between adjacent island areas S1, and a bridge area S2 connecting adjacent island areas S1. Specifically, the island areas S1 can be rectangular, the opening areas S3 can be strip-shaped, and each strip-shaped opening area S3 can be located in the gap between two adjacent island areas S1. The extension direction of each strip-shaped opening area S3 may be the same as the extension direction of a side or edge of an island area S1.

The touch display panel 100 may include a substrate film layer, a display functional film layer, an encapsulation film layer, and a touch functional film layer sequentially stacked in the thickness direction of the touch display panel 100. The substrate film layer, the display functional film layer, the encapsulation film layer and the touch functional film layer are located in the island areas S1 and the opening areas S3. It should be noted that the opening areas S3 in embodiments the present disclosure are through holes that penetrate the entire touch display panel 100, that is, the through holes penetrate through the substrate film layer, the display functional film layer, the encapsulation film layer and the touch functional film layer, and the touch display panel 100 does not have any film structure in the opening areas S3.

In embodiments of the present disclosure, by forming through holes that penetrate the entire touch display panel 100, the stretchability and bending performance of the touch display panel 100 can be improved and thus, the touch display panel 100 can have wide applications.

The touch display panel 100 according to an embodiment of the present disclosure will be described in detail below with reference to the accompanying drawings.

Figure 2:
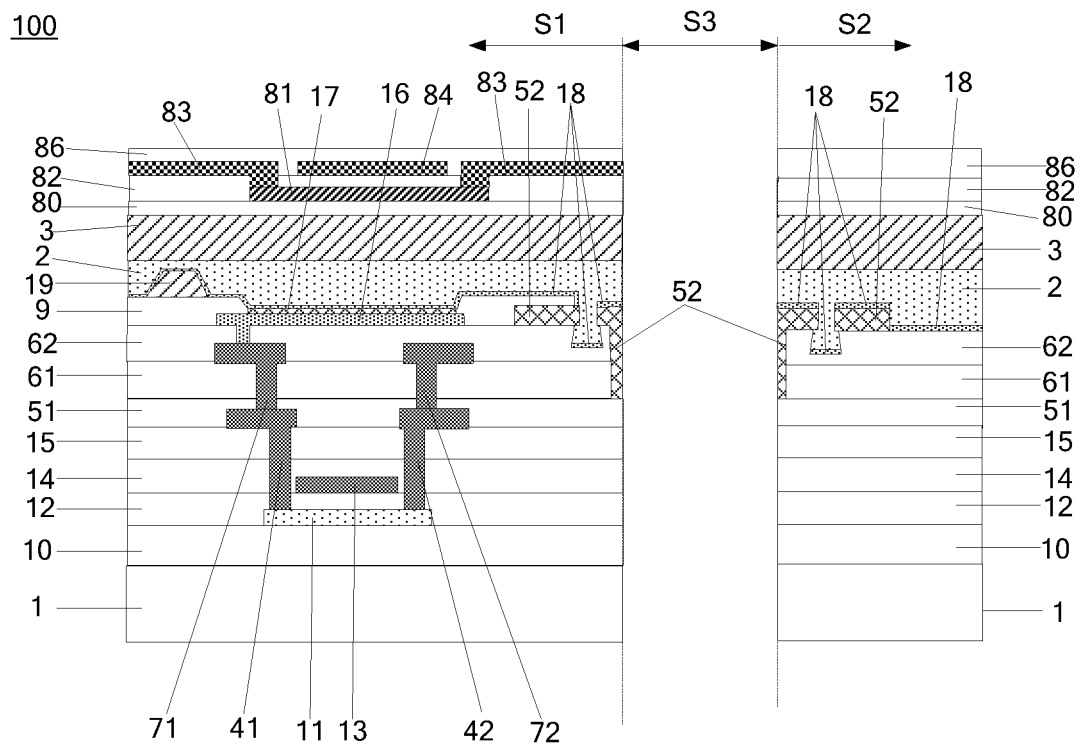
FIG. 2 shows a schematic cross-sectional structure view taken along a line E-F in FIG. 1.

The substrate film layer 1 may be a flexible substrate to improve the stretchability and bending performance of the touch display panel 100. For example, the substrate film layer 1 may have a single-layer structure as shown in FIG. 2, but it is not limited to this, and the substrate film layer 1 may also have a multilayer structure. The material of the substrate film layer 1 may be polyimide (PI), but is not limited to this, and the substrate film layer 1 can be made of other materials.

The display functional film layer may include a first part located in the island areas S1 and a second part located in the bridge area S2.

The first part may include a plurality of thin film transistors and a plurality of pixels. Each pixel may include three sub-pixels, namely a red sub-pixel, a green sub-pixel, and a blue sub-pixel. As shown in FIG. 2, each of the thin-film transistors (TFTs) may include an active layer 11, a gate electrode 13, a drain electrode 41, a source electrode 42, a first transfer electrode 71, and a second transfer electrode 72. Each sub-pixel may include an anode 16, an organic light-emitting layer 17, and a cathode 18. That is, the sub-pixels mentioned in the embodiments of the present disclosure can be understood as organic light-emitting devices. The anode 16 of the sub-pixel can be in contact with the drain electrode 41 of the thin film transistor. It should be noted that the anode 16 of each sub-pixel in embodiments of the present disclosure can be independent of each other, and can be connected to a thin film transistor. The cathodes 18 of the sub-pixels can be arranged on the entire surface, that is, the cathodes 18 of the sub-pixels can be an integrated structure. The sub-pixels of different colors refer to colors of the organic light-emitting layers 17 of the sub-pixels are different.

Taking the thin film transistor having a top gate type as an example, the structure of the first part will be described in detail.

The first part may include:

a first buffer layer 10 formed on the substrate film layer 1;

an active layer 11 formed on the first buffer layer 10;

a first gate insulating layer 12 formed on the first buffer layer 10 and covering the active layer 11;

a gate electrode 13 formed on the first gate insulating layer 12;

a second gate insulating layer 14 formed on the first gate insulating layer 12 and covering the gate electrode 13;

an interlayer dielectric layer 15 formed on the second gate insulating layer 14;

a source electrode 42 and a drain electrode 41 formed in the same layer and formed on the interlayer dielectric layer 15;

a first passivation layer 51 formed on the interlayer dielectric layer 15 and covering the source electrode 42 and the drain electrode 41;

a first planarization layer 61 formed on the first passivation layer 51;

a first transfer electrode 71 and a second connecting electrode 72 formed in the same layer and formed on the planarization layer 61;

a second planarization layer 62 formed on the first planarization layer 61 and covering the first transfer electrode 71 and the second transfer electrode 72;

a second passivation layer 52 and an anode 16 formed on the second planarization layer 62;

a pixel define layer 9 formed on the second planarization layer 62 and exposing at least part of the anode 16;

spacers 19 formed on the pixel define layer 9;

an organic light emitting layer 17 formed on the anode 16; and a cathode 18 formed on the organic light emitting layer 17.

It should be understood that the source electrode 42 can pass through the interlayer dielectric layer 15, the second gate insulating layer 14, and the first gate insulating layer 12 to be in contact with one end of the active layer 11, and the drain electrode 41 can pass through the interlayer dielectric layer 15, the second gate insulating layer 14, and the first gate insulating layer 12 to be in contact with the other end of the active layer 11. The first transfer electrode 71 may pass through the first planarization layer 61 and the first passivation layer 51 to be in contact with the drain electrode 41. The second transfer electrode 72 may pass through the first planarization layer 61 and the first passivation layer 51 to be in contact with the source electrode 42. The anode 16 passes through the second planarization layer 62 to be in contact with the first transfer electrode 71.

As shown in FIG. 2, the second part may include a first buffer layer 10, a first gate insulating layer 12, a second gate insulating layer 14, an interlayer dielectric layer 15, a first passivation layer 51, a first planarization layer 61, a second planarization layer 62, and a second passivation layer 52. It should be understood that the first buffer layer 10, the first gate insulating layer 12, the second gate insulating layer 14, the interlayer dielectric layer 15, the first passivation layer 51, the first planarization layer 61, the second planarization layer 62, and the second passivation layer 52 in the second part and the first buffer layer 10, the first gate insulating layer 12, the second gate insulating layer 14, the interlayer dielectric layer 15, the first passivation layer 51, the first planarization layer 61, the second planarization layer 62, and the second passivation layer 52 in the first part are arranged in same layers, respectively, and may be formed as integrated structures.

The second part does not have the pixel define layer 9 and spacers 19 mentioned in the first part. Therefore, the overall thickness of the second part is smaller than the overall thickness of the first part.

In an embodiment of the present disclosure, the aforementioned thin film transistor TFT may not include the first transfer electrode 71 and the second transfer electrode 72, that is, the anode 16 of the sub-pixel may directly contact the drain electrode 41. Under such case, the display functional film layer may not include the second planarization layer 62, but the present disclosure is not limited to such structure.

In addition, the thin film transistor TFT according to embodiments of the present disclosure is not limited to the top-gate type, but may be a bottom-gate type. That is, the gate electrode 13 may be arranged on a side of the active layer 11 close to the first buffer layer 10, and the drain electrode 41 and the source electrode 42 can be directly connected to the two ends of the active layer 11 (i.e., connected to the two ends of the active layer 11 using their overlapping parts). Under such condition, the display functional film layer as a whole may not include the interlayer dielectric layer 15, and only one gate insulating layer may be provided, and the gate insulating layer is located on the gate electrode 13 and the active layer 11; however, embodiments of the present disclosure are not limited to such structure.

It should be understood that the first buffer layer 10, the first gate insulating layer 12, the second gate insulating layer 14, the interlayer dielectric layer 15, the first passivation layer 51, and the second passivation layer 52 mentioned in embodiments of the present disclosure may be inorganic film layers, that is, they may be made of inorganic insulating materials such as silicon oxide and silicon nitride. The first planarization layer 61, the second planarization layer 62, the pixel define layer 9, and the spacers 19 may be organic film layers, that is, they may be made of organic insulating materials such as photoresist or PI.

It should be noted that the first part is not limited to including the aforementioned thin film transistors (TFT), pixels, organic film layers and inorganic film layers, and may further include structures not shown in FIG. 2, such as, a storage capacitor, scan signal lines, data signal lines, and so on. The storage capacitor can include a first electrode plate arranged in the same layer as the drain electrode 41 and a second electrode plate arranged in the same layer as the first transfer electrode 71. The scan signal lines can be arranged in the same layer as the gate electrode 13. The data lines can be arranged in the same layer as the drain electrode 41, but is not limited to this. The storage capacitor, the scan signal lines, and the data lines may also be located on other layers. As shown in FIG. 2, the second part may also include a cathode 18, and the cathode 18 of the second part is connected to the cathode 18 of an adjacent first part, that is, the cathodes 18 in the first part and the second part are arranged in the same layer and are formed as an integrated structure. The second part may also include a signal transfer line (not shown in the figure), this signal transfer line can be used to connect the thin film transistors (TFTs), sub-pixels or signal lines and so on in the first parts in adjacent island areas S1, to achieve signal transmission between the first parts of the adjacent island area S1. The signal transfer line in the second part can be arranged in the same layer as at least one of the gate electrode 13, the drain electrode 41, the first transfer electrode 71, and the anode 16 in the first part.

In specific implementations, as shown in FIG. 2 and FIG. 10 to FIG. 12c, the first planarization layer 61 has a first hollow hole K1 in which the boundary of an opening area S1 is located, and the second planarization layer 62 has a second hollow hole K2 in which the boundary of the opening area S1 is located. The boundary of the second hollow hole K2 coincides with the boundary of the first hollow hole K1. A part of the second passivation layer 52 located in the island area S1 and close to the opening area S3 is in contact with the first passivation layer 51 through the second hollow hole K2 penetrating the second planarization layer 62 and the first hollow hole K1 penetrating the first planarization layer 61. A part of the second passivation layer 52 located in the bridge area S2 and close to the opening area S3 is in contact with the first passivation layer 51 through the second hollow hole K2 penetrating the second planarization layer 62 and the first hollow hole K1 penetrating the first planarization layer 61.

In embodiments of the present disclosure, the first planarization layer 61 has a first hollow hole K1 within which the boundary of the opening area S1 is located, and the second planarization layer 62 has a second hollow hole K2 within which the boundary of the opening area S1 is located and thus, the second passivation layer 52 is in contact with the first passivation layer 51 through the second hollow hole K2 and the first hollow hole K1, so that the boundary of the island area S1 and the bridge area S2 can be separated from the boundary seal between the second passivation layer 52 and the first passivation layer 51. Accordingly, such structure improves the sealing performance of the display functional film layer at the boundary of the island area S1.

In specific implementations, as shown in FIG. 2 and FIG. 11 to FIG. 12c, a part of the second planarization layer 62 located in the island area S1 and close to the second hollow hole K2 and a part of the second planarization layer 62 located in the bridge area S2 and close to the second hollow hole K2 are provided with a first isolation groove 621 and a second isolation groove 622, respectively. The depth of each of the first isolation groove 621 and the second isolation groove 622 is smaller than the thickness of the second planarization layer. A part of the second passivation layer 52 corresponding to the first isolation groove 621 is provided with a first hole 521 communicating with the first isolation groove 621. A part of the second passivation layer 52 corresponding to the second isolation groove 622 is provided with a second hole 522 communicating with the second isolation groove 622. In embodiments of the present disclosure, when common layers (such as the hole injection layer, the hole transport layer, the electron transport layer or the electron injection layer, and the patterns of the common layers may be same as that of the cathode 18) of the cathode 18 and the organic light-emitting device are vapor-deposited, the patterns of the common layers of the cathode 18 and the organic light-emitting device may be discontinuous at the first isolation groove 621 and the second isolation groove 622 to prevent external water and oxygen from intruding into a region of island area S1 where the pixels are located from the opening area S3 along the common layers, which may affect the light emission and display of the region where the pixels are located.

Figure 11:
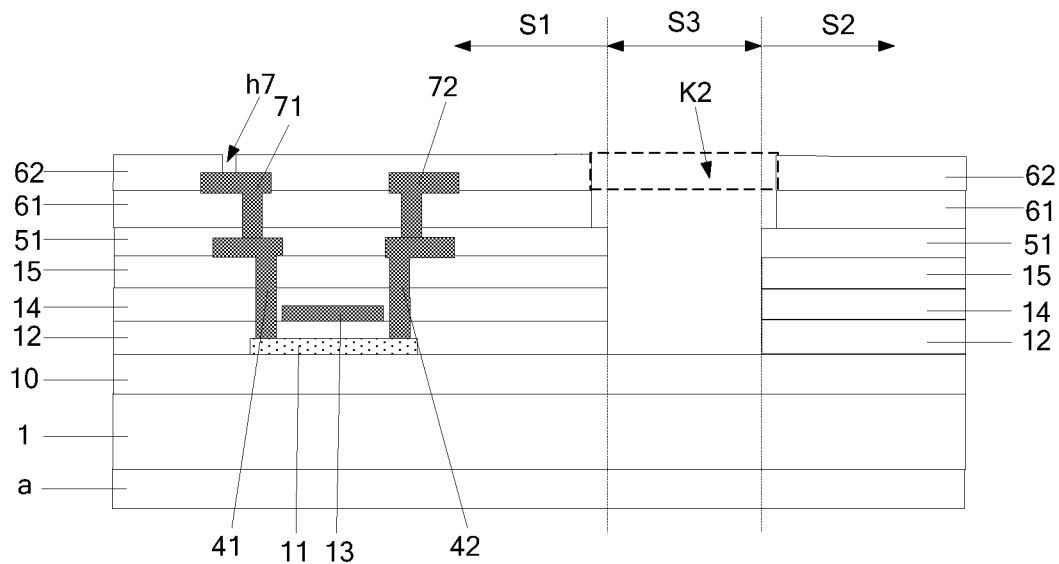
FIG. 11 shows a schematic structural diagram after step S2011 is completed.

It should be noted that, as shown in FIG. 11, the width of each of the first isolation groove 621 and the second isolation groove 622 gradually increases from the top to the bottom of the groove, which can better block the common layers of the cathode 18 and the organic light-emitting devices.

In addition, as shown in FIG. 2 and FIG. 12c to FIG. 13, a central hole 520 exposing the second planarization layer 62 is formed in a central portion of the second passivation layer 52 that is located on a side of the first hole 521 away from the opening area S3, so that the anode 16 may be formed on the second planarization layer 62 corresponding to the central hole 520.

It should be noted that the aforementioned pixel define layer 9 can cover the part of the second passivation layer 52 between the central hole 520 and the first hole 521, as shown in FIG. 2.

As shown in FIG. 2, the encapsulation film layer film layer may include an inorganic encapsulation film layer 2 located in the island areas S1 the bridge areas S2. The inorganic encapsulation film layer 2 is formed after the cathode 18. As shown in FIG. 2 and FIG. 12 to FIG. 20, the inorganic encapsulation layer 2 covers the cathode 18 and is filled in the first isolation groove 621, the first hole 521, the second isolation groove 622, and the second hole 522, so that the sealing performance of the region of each island area S1 where pixels are located can be further strengthened by the inorganic encapsulation layer 2 sealing performance. It should be noted that the inorganic encapsulation layer 2 located in the island areas S1 and the bridge areas S2 are provided in the same layer. For example, the inorganic packaging layer 2 can be made of inorganic insulating materials such as silicon oxide and silicon nitride.

As shown in FIG. 2, the encapsulation film layer may also include an organic encapsulation layer 3 formed on a side of the inorganic encapsulation layer 2 away from the cathode, that is, the organic encapsulation layer 3 is formed after the inorganic encapsulation layer 2. The organic encapsulation layer 3 is located on the island areas S1 and bridge areas S2. In embodiments of the present disclosure, the inorganic encapsulation layer 2 can be protected by the organic encapsulation layer 3, which reduces the probability of fracture of the inorganic encapsulation layer 2 covering the island areas S1 and the bridge areas S2.

For example, the organic encapsulation layer 3 of embodiments of the present disclosure is an optical adhesive layer, such as a positive photoresist or a negative photoresist. Some other organic encapsulation materials that are used in inkjet printing processes cannot achieve precise control to not to print the organic packaging material in the opening area S3, because the precision of the inkjet printing process is limited currently. In embodiments of the present disclosure, the organic encapsulation layer 3 is an optical adhesive layer and, when the organic packaging layer 3 is patterned to form the third hollow hole K3 shown in FIG. 2 (the third hollow hole K3 is a part of the through hole), the organic encapsulation layer can be patterned by a photolithography (such as wet etching) process. Due to the high precision of the photolithography process, precise manufacturing in which no organic encapsulation layer 3 is formed at the opening area S3 can be achieved.

The touch functional film layer may be formed after the organic encapsulation layer 3. The touch functional film layer may include a third part located in the island areas S1 and a fourth part located in the bridge areas S2.

Figure 3:
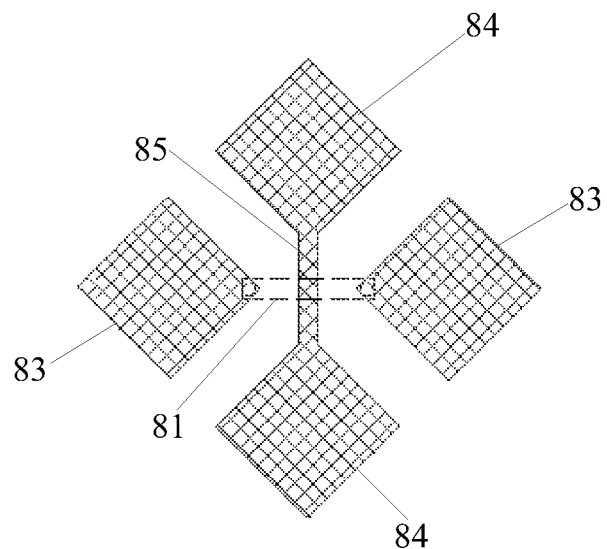
FIG. 3 shows a schematic diagram of a top view structure of a touch functional film layer located in an island area in a touch display panel according to an embodiment of the present disclosure.

As show in FIG. 2 and FIG. 3, the third part may include:
a second buffer layer 80;
a plurality of first conductive bridges 81 formed on the second buffer layer 80;
a touch insulating layer 82 formed on the second buffer layer 80 and covering the conductive bridges 81;
a plurality of first touch electrodes 83 and a plurality of second touch electrodes 84 and a plurality of second conductive bridges 85 formed on the touch insulating layer 82 and arranged in the same layer;
an organic protective layer 86 formed on touch insulating layer 82 and covering the first touch electrode 83, the second touch electrode 84, and the second conductive bridge 85.

As shown in FIG. 2, FIG. 3, and FIG. 16 to FIG. 20, the touch insulating layer 82 has a plurality of third holes 820, and the third holes expose a portion of the first conductive bridges 81. Each of adjacent first electrodes 83 is in contact with a same first conductive bridge 81 through a third hole 820, and adjacent second touch electrodes 84 are in contact with each other through one of the second conductive bridges 85, and the first touch electrodes 83 and the second touch electrodes 84 are insulated from each other.

As shown in FIG. 2, the fourth part may include a second buffer layer 80, a touch insulating layer 82 and an organic protection layer 86. It should be noted that the fourth part may also include a touch trace (not shown in the figure), and this touch trace may be provided in the same layer as at least one of the first conductive bridges 81 and the second conductive bridges 85. The touch trace can be used to connect the touch electrodes in the adjacent island areas S1; however, embodiments of the present disclosure are not limited to this. In some other embodiments, the touch trace may not be provided in the same layer as the first conductive bridges 81 and the second conductive bridges 85.

It should be understood that when the touch trace is disposed on the same layer as at least one of the first conductive bridges 81 and the second conductive bridges 85, in order to make the touch trace and the first conductive bridges 81 and the second conductive bridges 85 are at the same height, when the organic encapsulation layer 3 is made, the thickness of the organic encapsulation layer 3 at the bridge areas S2 is greater than the thickness of the organic encapsulation layer 3 at the island areas S1. In this way, when the touch functional film layer is subsequently formed, parts of the touch functional film layer located in the island areas S1 and the bridge areas S2 can be at the same height, so as to reduce the difficulties in connection design of the touch trace in the touch functional film layer located in the bridge areas S2 and the first conductive bridges 81, the second conductive bridges 85, the first touch electrodes 83, and the second touch electrodes 84 in the island areas S1.

It should be noted that the second buffer layer 80 and the touch insulating layer 82 mentioned in the embodiments of the present disclosure may be inorganic insulating layers, that is, they may be made of inorganic insulating materials such as silicon oxide and silicon nitride. The organic protective layer 86 in embodiments of the present disclosure may be an optical adhesive layer, such as a positive photoresist or a negative photoresist. Some other organic protective materials that are used in inkjet printing processes cannot achieve precise control to not to print the organic protective material in the opening area S3, because the precision of the inkjet printing process is limited currently. In embodiments of the present disclosure, the organic protective layer 86 is an optical adhesive layer, and when the organic protective layer 86 is patterned to form the fourth hollow hole K4 as shown in FIG. 2 (the hollow hole K4 is a part of the through hole), a photolithography (for example, wet etching) process can be used to pattern the organic protective layer 86. Due to the high precision of the photolithography process, precise manufacturing in which no organic protective layer 3 is formed at the opening area S3 can be achieved.

In addition, it should be noted that the first conductive bridges 81, the second conductive bridges 85, the first touch electrodes 83, and the second touch electrodes 84 mentioned in embodiments of the present disclosure may be a metal mesh structure.

Figure 4:
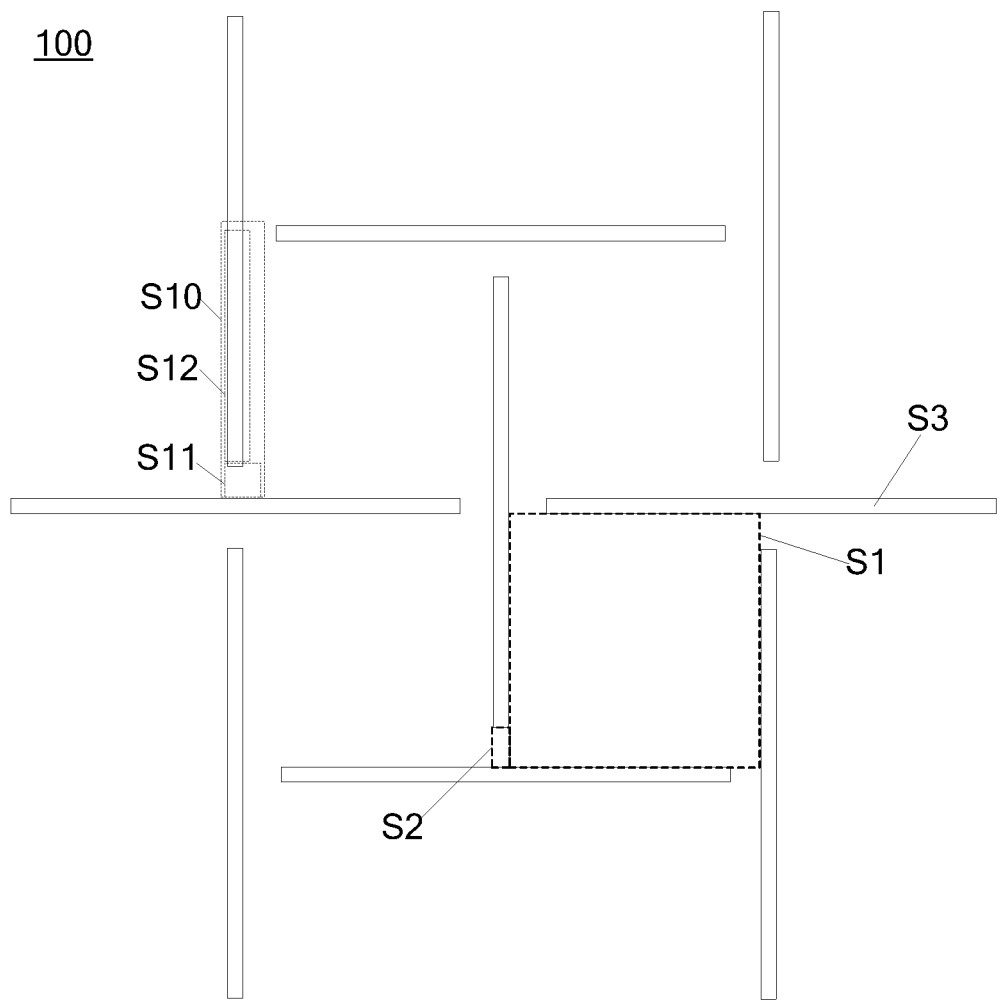
FIG. 4 shows a schematic diagram of a relationship between each side of each island area and other island areas according to an embodiment of the present disclosure.

In specific implementation, as shown in FIG. 4, the island areas S1 are rectangular. An island area S1 has at least one side S10 (for example, the left side of the island area S1 in the upper left of FIG. 4). A part S11 is connected to an adjacent island area S1 (another island area S1 on the left side of the island area S1) through a bridge area S2. The remaining part S12 is surrounded by an opening area S3 that extends in the same direction as the side S10. Specifically, each side S10 of each island area S1 has a part S11 connected to an adjacent island area S1 through a bridge area S2, and the remaining part S12 is surrounded by an opening area S3 that extends in the same direction as the side S10.

Figure 5:
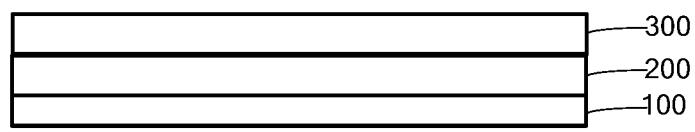
FIG. 5 shows a schematic diagram of a side view structure of a touch display device according to an embodiment of the present disclosure.

Based on the same inventive concept, an embodiment of the present disclosure also provides a touch display device, as shown in FIG. 5, the touch display device may include the touch display panel 100 provided by any of the foregoing embodiments of the present disclosure. The touch display panel may also include a cover 300. A side of the touch functional film layer in the touch display panel 100 away from the substrate film layer 1 can be attached to the cover plate 300.

In the embodiments of the present disclosure, the touch display panel 100 is directly manufactured by integrating the touch functional film layer on the display functional film layer, and then the touch display panel 100 is attached and assembled with other structures such as a cover plate 300 to form a touch display device. Compared with technical solutions in which the touch functional film layer and the display functional film layer are formed separately, and then assembled with the cover plate 300 or other structures to form a touch display device, the bonding or attaching process flows can be reduced, which can reduce the occurrence of wrinkles, thereby further improving product quality.

For example, the cover plate 300 may be a curved cover plate, such as a four-sided curved cover plate (i.e., a four-sided curved cover plate), etc.; however, embodiments of the present disclosure are not limited to this, and in some other embodiments, the cover plate 300 may be flat.

As shown in FIG. 5, when the touch display panel 100 in embodiments of the present disclosure are OLED displays, the touch display device may further include a circular polarizer 200 located between the touch display panel 100 and the cover plate to reduce product reflectivity and improve display effect.

In embodiments of the present disclosure, the specific type of the touch display device is not particularly limited, and the touch display device can be all types of touch display devices commonly used in the field, such as mobile phones, computers, watches, in-vehicle equipment, medical equipment, and so on. Those skilled in the art can make a corresponding selection according to specific purposes of the touch display device, and details are not described herein again.

It should be noted that, in addition to the touch display panel 100, the circular polarizer 200, and the cover plate 300, the touch display device may further include other necessary parts and components. Taking a mobile phone as an example, the mobile phone may include a housing, a circuit board, and power lines and so on. One of ordinary skill in this art can know other structures according to specific use requirements of the display device and details are omitted here.

Based on the same inventive concept, embodiments of the present disclosure also provide a method for manufacturing the touch display panel 100 described in any of the foregoing embodiments. For details of the touch display panel, please refer to the structures described in any of the foregoing embodiments, and repeated descriptions are omitted here.

Figure 6:
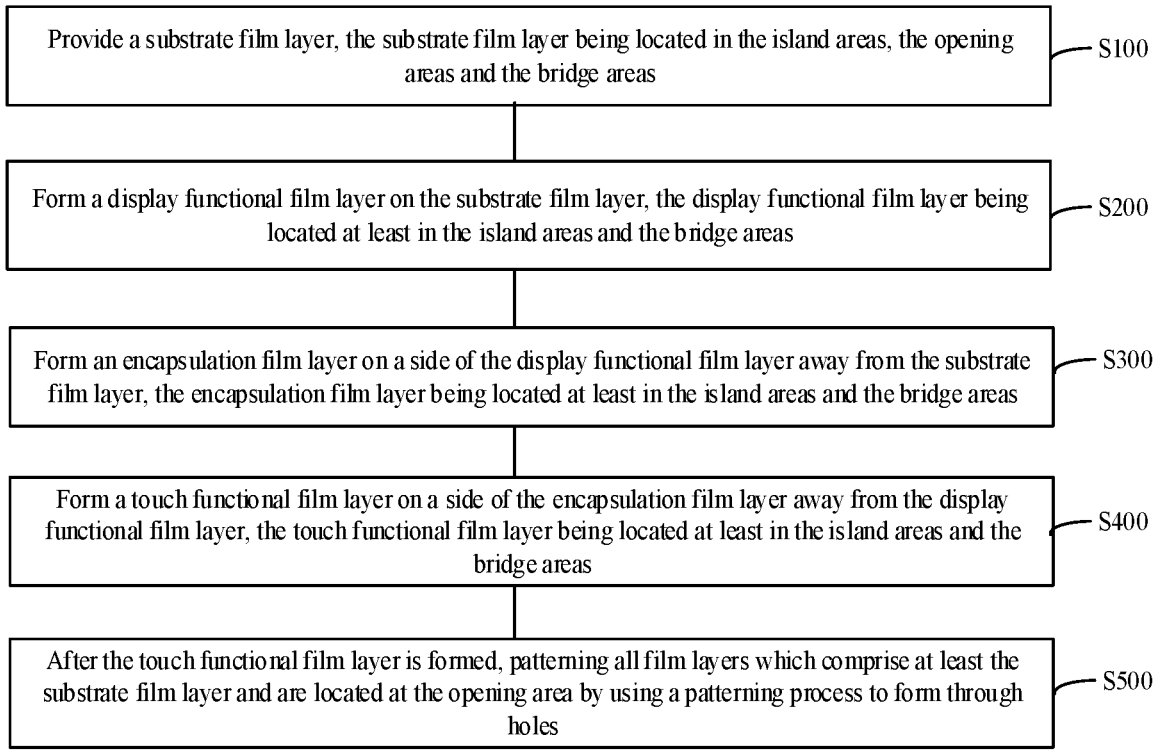
FIG. 6 shows a flowchart of a method for manufacturing a touch display panel according to an embodiment of the present disclosure.

FIG. 6 is a flow chart of a method for manufacturing a touch display panel 100 according to an embodiment of the present disclosure. The method may include the following steps:

In step S100, a substrate film layer is provided. The substrate film layer is located in the island areas, the opening area, and the bridge area.

In step S200, a display functional film layer is formed on the substrate film layer. The display functional film layer is located at least in the island areas and the bridge area.

In step S300, an encapsulation film layer is formed on a side of the display functional film layer away from the substrate film layer. The encapsulation film layer is located at least in the island areas and the bridge area.

In step S400, a touch functional film layer is formed on a side of the encapsulation film layer away from the display functional film layer. The touch functional film layer is located at least in the island areas and the bridge area.

In step S500, after the touch functional film layer is formed, all film layers which include at least the substrate film layer and are located at the opening area are patterned by using a patterning process to form a through hole.

In embodiments of the present disclosure, after the touch functional film layer is formed, all film layers which include at least the substrate film layer and are located at the opening area are patterned to form a through hole penetrating the entire touch display panel. That is, the hole in the substrate film layer is punched after the film layers of the entire touch display panel are formed. This can avoid residues of other film layers at the opening of the substrate film layer, and can thus avoid cracks which may easily appear at the opening during stretching or bending due to the residues of other film layers at the opening. Consequently, embodiments of the present disclosure can avoid the problem of package failure at the opening and improve product quality.

Hereinafter, steps in the manufacturing method of the touch display panel will be described in detail with reference to the accompanying drawings.

Figure 7:
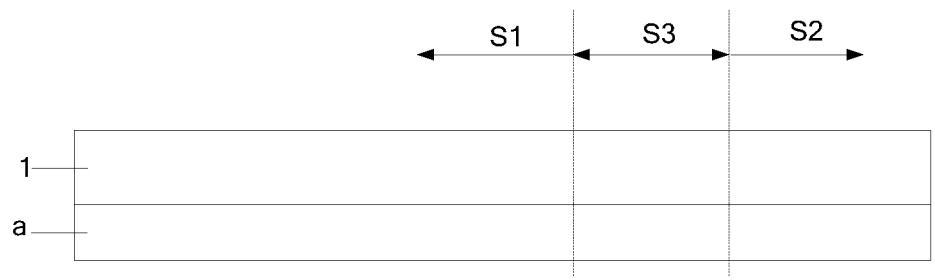
FIG. 7 shows a schematic structural diagram after step S100 is completed.

In step S100, a substrate film layer 1 is formed on a carrier glass a, and the substrate film layer 1 is located in the island areas S1, the opening areas S3, and the bridge areas S2, as shown in FIG. 7.

Step S200 may include the following steps.

In step S2001, a first buffer layer 10 is formed on the substrate film layer 1. The first buffer layer 10 is located in the island areas S1, the bridge areas S2 and the opening areas S3.

In step S2002, an active layer 11 is formed on a side of the first buffer layer 10 away from the substrate film layer 1. The active layer 11 is located in the island areas S1.

In step S2003, a first gate insulating layer 12 is formed on a side of the active layer 11 away from the first buffer layer 10. The first gate insulating layer 12 is located in the island areas S1, the bridge areas S2, and the opening areas S3.

In step S2004, a third metal layer is formed on a side of the first gate insulating layer 12 away from the active layer 11. The third metal layer at least includes the gate electrode 13 located in each island area S1.

In step S2005, a second gate insulating layer 14 is formed on a side of the third metal layer away from the first gate insulating layer 12. The second gate insulating layer 14 is located in the island areas S1, the bridge areas S2, and the opening areas S3.

In step S2006, an interlayer dielectric layer 15 is formed on a side of the second gate insulating layer 14 away from the third metal layer. The interlayer dielectric layer 15 is located in the island areas S1, the bridge areas S2, and the opening areas S3.

Figure 8:
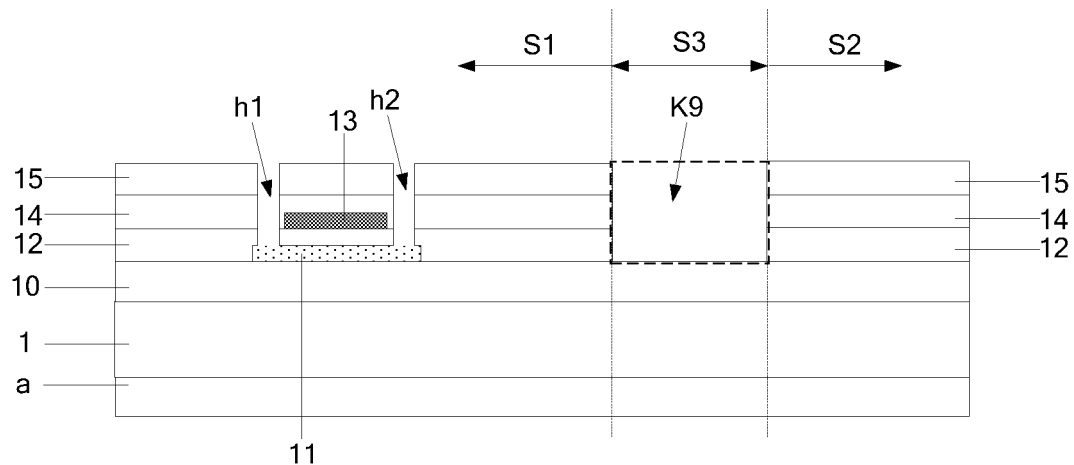
FIG. 8 shows a schematic structural diagram after step S2006 and before step S2007.

It should be noted that after the step S2006 is completed, the interlayer dielectric layer 15, the second gate insulating layer 14 and the first gate insulating layer 12 may be patterned as a whole to form the first through hole h1 and the second through hole h2 in the island areas S1 and the ninth hollow hole K9 located in the opening areas S3. The first through hole h1 exposes one end of the active layer 11, the second through hole h2 exposes the other end of the active layer 11, and the boundary of the ninth hollow hole K9 coincides with the boundary of the opening area S3 and exposes the first buffer layer 10, as shown in FIG. 8.

Step S200 further includes the following steps.

In step S2007, a first metal layer is formed on a side of the interlayer dielectric layer 15 away from the second gate insulating layer 14. The first metal layer includes at least the drain electrode 41 and the source electrode 42 located in each island area S1. The drain electrode 41 passes through the interlayer dielectric layer 15, the second gate insulating layer 14, and the first gate insulating layer 12 (that is, through the first through hole h1) to be in contact with one end of the active layer 11. The source electrode 42 passes through the interlayer dielectric layer 15, the second gate insulating layer 14, and the first gate insulating layer 12 (that is, through the second through hole h2) to be in contact with the other end of the active layer 11.

Figure 9:
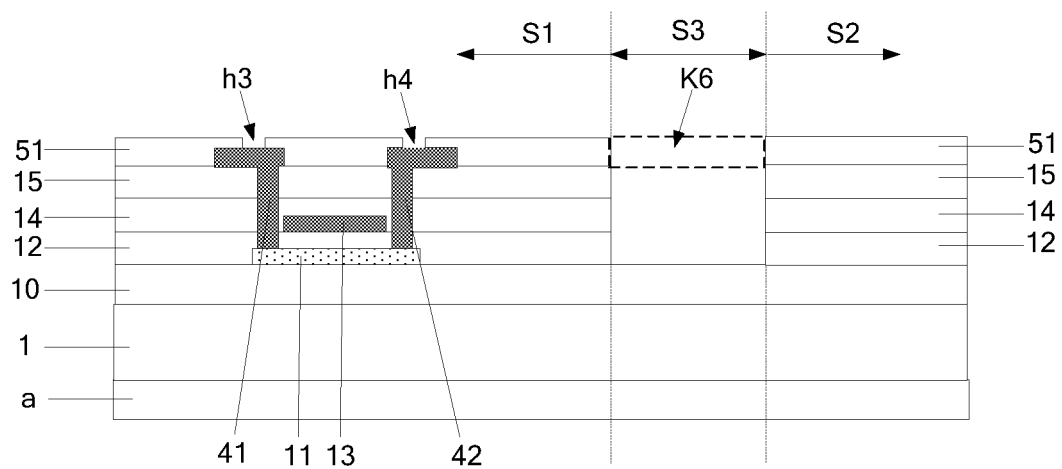
FIG. 9 shows a schematic structural diagram after step S2008 is completed.
Figure 10:
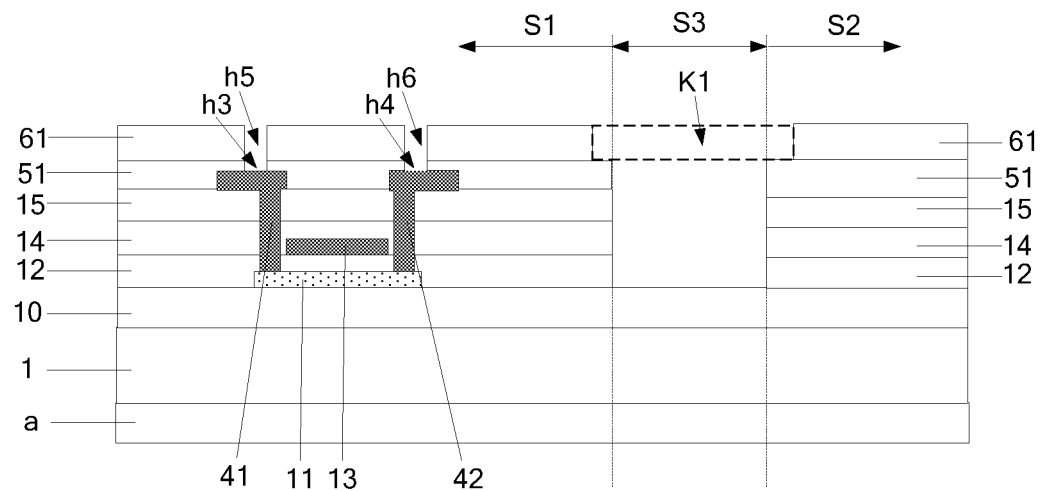
FIG. 10 shows a schematic structural diagram after step S2009 is completed.

In step S2008, a first passivation layer 51 is formed on a side of the first metal layer away from the substrate film layer 1. The first passivation layer 51 is located in the island areas S1 and the bridge areas S2, and the first passivation layer 51 has a sixth hollow hole K6 in the opening area S3. The boundary of the sixth hollow hole K6 coincides with the boundary of the opening area S3. It should be noted that the first passivation layer 51 also has a third through hole h3 and a fourth through hole h4 located in the island areas S1. The third through hole h3 exposes a part of the drain electrode 41, and the fourth through hole h4 exposes a part of the source electrode 42, as shown in FIG. 9. It should be understood that the third through hole h3, the fourth through hole h4, and the sixth hollow hole K6 are arranged in the same floor.

In step S2009, a first planarization layer 61 is formed on a side of the first passivation layer 51 away from the first metal layer. The first planarization layer 61 is located in the island areas S1 and the bridge areas S2, and the first planarization layer 61 has first hollow hole K1 within which a boundary of the opening area S3 is located, and the first hollow hole K1 exposes the first passivation layer 51. In addition, a part of the first planarization layer 61 located in the island areas S1 also has a fifth through hole h5 that overlaps the third through hole h3 and a sixth perforation h6 that overlaps the fourth through hole h4, shown in FIG. 10. It should be noted that the fifth through hole h5 and the sixth through hole h6 and the first hollow hole K1 can be arranged in the same layer.

In step S2010, a second metal layer is formed on a side of the first planarization layer 61 away from the first passivation layer 51. The second metal layer includes at least a first transfer electrode 71 and a second transfer electrode 72 located in each island area S1. The first transfer electrode 71 passes through the first planarization layer 61 and the first passivation layer 51 (that is, through the fifth through hole h5 and the third through hole h3) to contact the drain electrode 41, and the second transfer electrode 72 passes through the first planarization layer 61 and the first passivation layer 51 (that is, through the sixth through hole h6 and the fourth through hole h4) to contact the source electrode 42.

In step S2011, a second planarization layer 62 is formed on a side of the second metal layer away from the first planarization layer 61. The second planarization layer 62 is located in the island areas S1 and the bridge areas S2, and the second planarization layer 62 has a second hollow hole K2 within which a boundary of the opening area S3 is located, and a seventh hole h7 provided in the same layer as the second hollow hole K2. It should be noted that the second hollow hole K2 is aligned with the first hollow hole K1, and the seventh through hole h7 exposes a part of the first transfer electrode 71, as shown in FIG. 11.

Figure 12A:
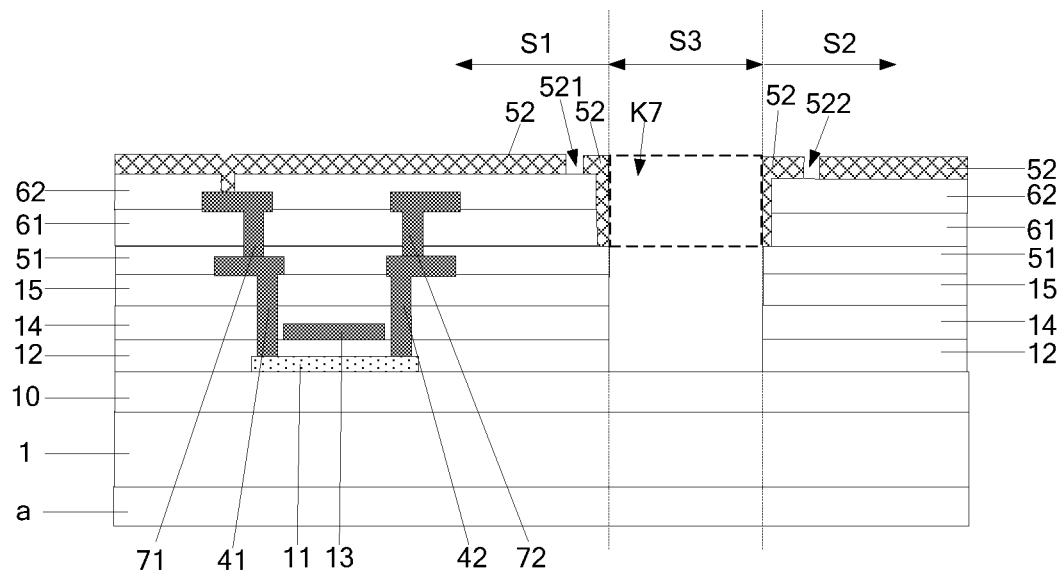
FIG. 12A shows a schematic structural diagram after step S2012 is completed.

In step S2012, a second passivation layer 52 is formed on a side of the second planarization layer 62 away from the first planarization layer 61. The second passivation layer 52 is located in the island areas S1 and the bridge areas S2, and contacts the first passivation layer 51 through the second hollow hole K2 and the first hollow hole K1. The second passivation layer 52 has a seventh hollow hole K7 located in the opening area S3. The boundary of the seventh hollow hole K7 coincides with the boundary of the opening area S3. It is noted that the second passivation layer 52 also has a first hole 521 and a second hole 522 arranged in the same layer as the seventh hollow hole K7. The first hole 521 is located in the island area S1 and is close to the opening area S3, and the second hole 522 is located in the bridge area S2 and close to the opening area S3, as shown in FIG. 12A.

After step S2012, step S200 may further include the following steps.

Figure 12B:
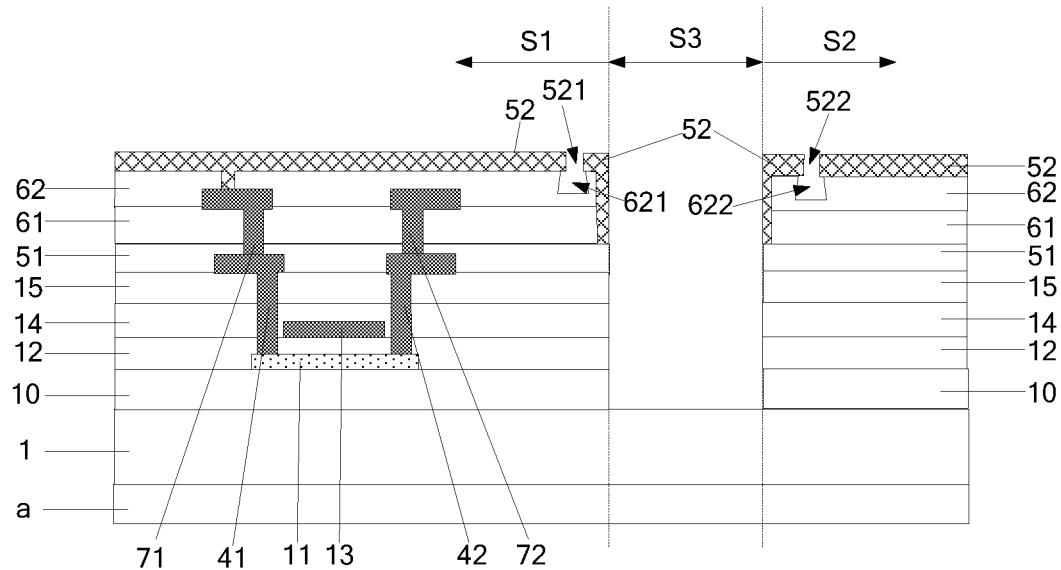
FIG. 12B shows a schematic structural diagram after step S2013a is completed.

In step S2013a, patterning is performed on portions of the second planarization layer 62 corresponding to the first hole 521 and the second hole 522, so that the first isolation groove 621 and the second isolation groove 622 communicating with the first hole 521 and the second hole 522, respectively are formed on the second planarization layer 62. The depth of each of the first isolation groove 621 and the second isolation groove 622 is less than the thickness of the second planarization layer 62, as shown in FIG. 12B.

Figure 12C:
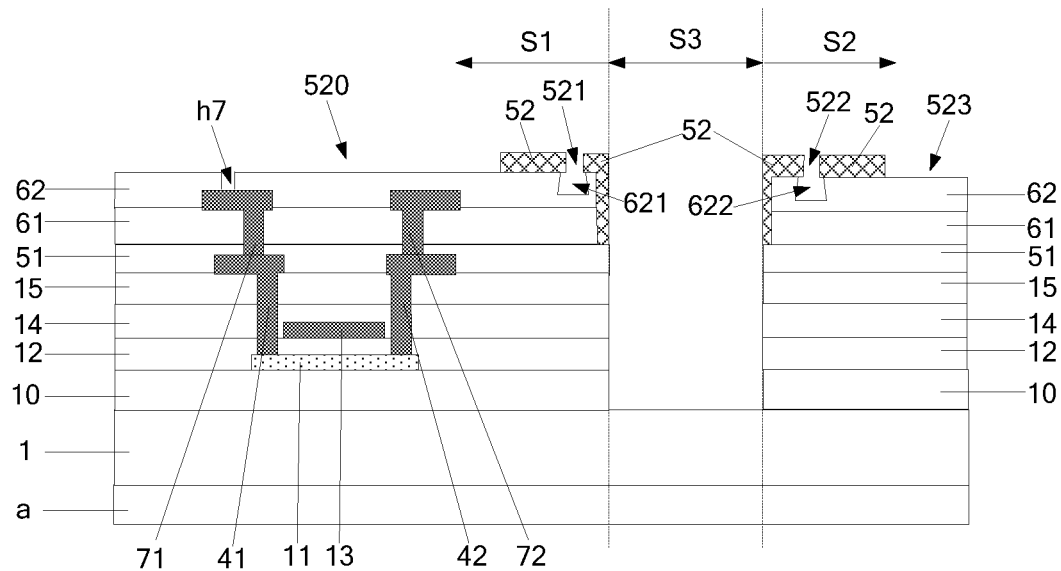
FIG. 12C shows a schematic structural diagram after step S2013b is completed.

In step S2013b, patterning is performed on the central portion of the second passivation layer 52 that is located at a side of the first hole 521 away from the hole area S3 to form a central hole 520 exposing the second planarization layer 62, as shown in FIG. 12C. In addition, a central part of the second passivation layer 52 located at a side of the second hole 522 away from the hole area S3 may also have a vent hole 523 exposing the second planarization layer 62. The vent hole 523 and the central hole 520 are provided in the same layer. It should be understood that step S2013b is executed after step S2013a.

It should be noted that when the first transfer electrode 71 and the second transfer electrode 72 are not provided, the manufacturing process of the second planarization layer 62 can be omitted.

Step S200 may further include the following steps.

In step S2014, the anode 16 is formed on the second planarization layer 62 corresponding to the central hole 520. The anode 16 passes through the second planarization layer 62 (i.e., through the seventh through hole h7) to contact the first transfer electrode 71. For example, the anode 16 can be formed by vapor deposition along with etching.

In step S2015, the pixel define layer 9 located in the island areas S1 is formed on a side of the anode 16 away from the second planarization layer 62. The pixel define layer 9 has a pixel opening 90 exposing at least a part of the anode 16, and the pixel define layer 9 covers a part of the passivation layer 52 between the central hole 520 and the first hole 521.

Figure 13:
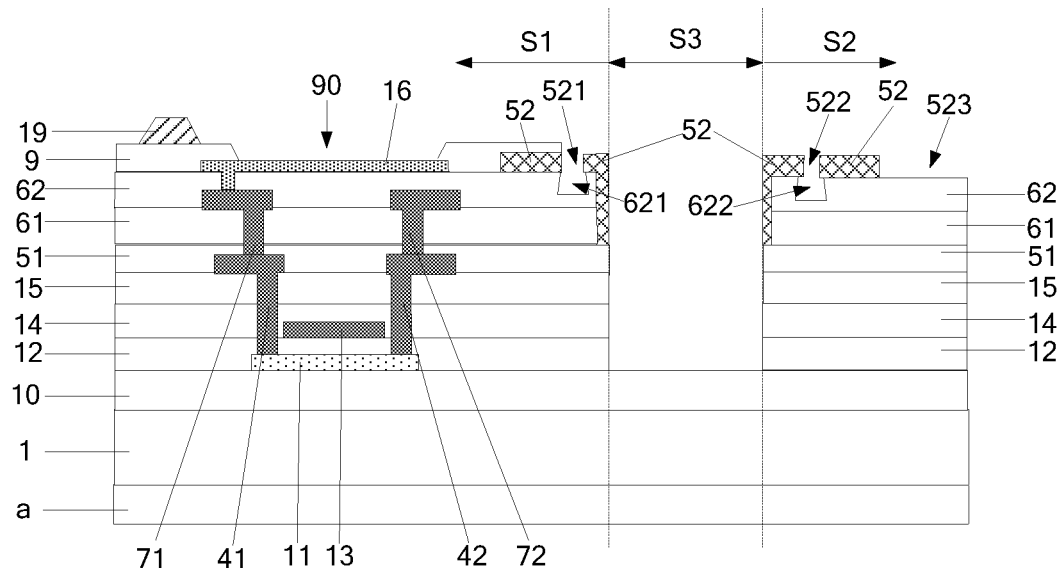
FIG. 13 shows a schematic structural diagram after step S2016 is completed.

In step S2016, spacers 19 located in the island areas S1 are formed on a side of the pixel define layer 9 away from the anode 16. The orthographic projection of each spacer 19 on the substrate film layer 1 is located in the orthographic projection of the pixel define layer 9 on the substrate film layer 1, as shown in FIG. 13.

In step S2017, the organic light-emitting layer 17 in contact with the anode 16 is formed in the pixel opening 90. For example, the organic light-emitting material can be vapor-deposited in the pixel opening 90 to form the organic light-emitting layer 17 by vapor deposition.

Figure 14:
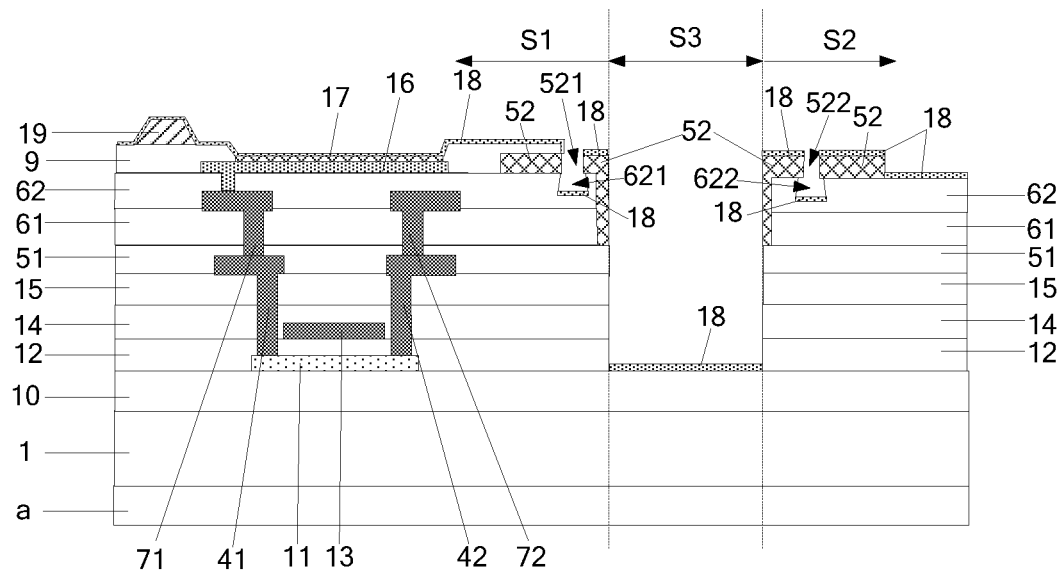
FIG. 14 shows a schematic structural diagram after step S2018 is completed.

In step S2018, a cathode 18 is formed on a side of the organic light-emitting layer 17 away from the anode 16. The cathode 18 is located in the island areas S1, the bridge areas S2 and the opening areas S3, and the cathode 18 is discontinuous in the first isolation groove 621, the second isolation groove 622, and the opening area S3, as shown in FIG. 14.

Step S300 may include the following steps.

In step S3001, an inorganic encapsulation layer 2 is formed on a side of the cathode 18 away from the organic light-emitting layer 17. The inorganic encapsulation layer 2 is located in the island areas S1, the bridge areas S2, and the opening areas S3, and the inorganic encapsulation groove is filled in the first isolation groove 621, the first hole 521, the second isolation groove 622, and the second hole 522.

Figure 15:
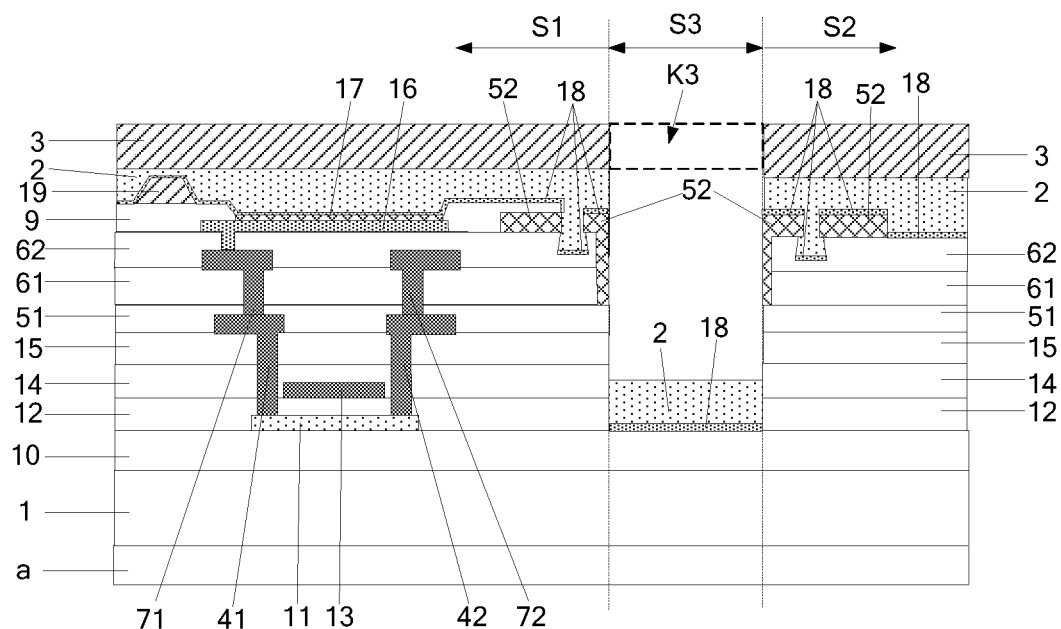
FIG. 15 shows a schematic structural diagram after step S3002 is completed.

In step S3002, an organic encapsulation layer 3 is formed on a side of the inorganic encapsulation layer 2 away from the cathode 18. The organic encapsulation layer 3 is located in the island areas S1 and the bridge areas S2, and the organic encapsulation layer 3 has a third hollow hole K3 located in each opening area S3. The boundary of the third hollow hole K3 coincides with the boundary of the opening area S3, as shown in FIG. 15. It should be noted that the organic encapsulation layer 3 may be an optical adhesive layer, and the third hollow hole K3 may be formed using a photolithography process.

Step S400 may include the following steps.

In step S4001, a second buffer layer 80 is formed on a side of the organic encapsulation layer 3 away from the inorganic encapsulation layer 2. The second buffer layer 80 is located in the island areas S1, the bridge areas S2, and the opening areas S3.

In step S4002, a conductive layer is formed on a side of the second buffer layer 80 away from the organic encapsulation layer 3. The conductive layer includes a plurality of first conductive bridges 81 at least located in the island areas S1.

Figure 16:
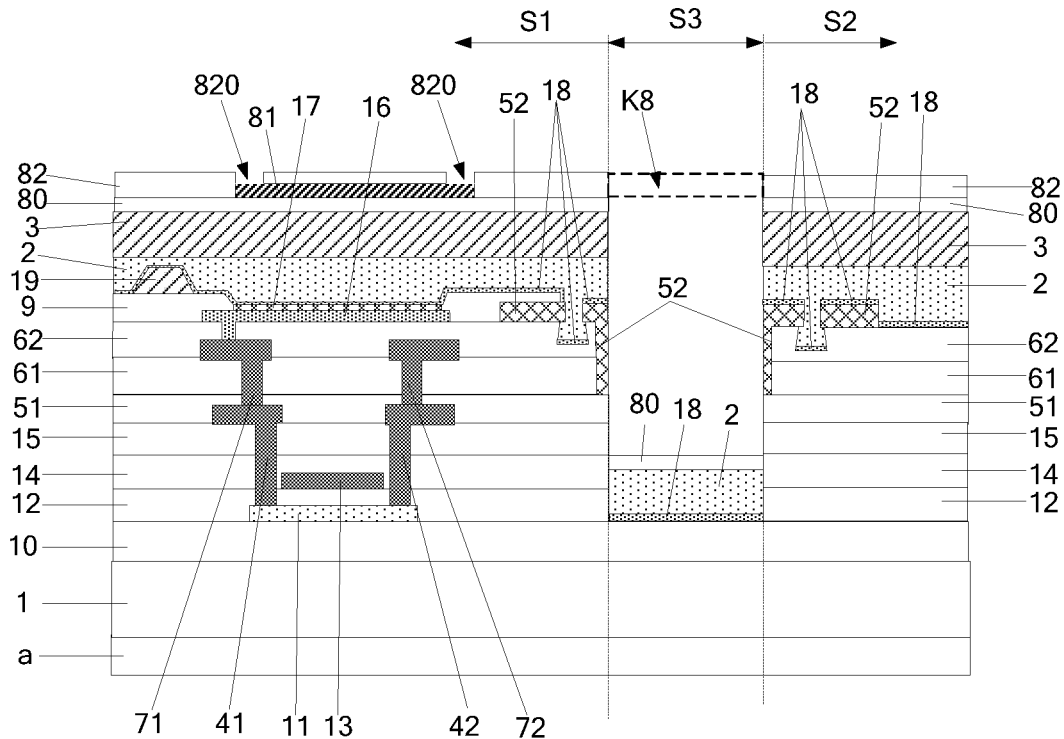
FIG. 16 shows a schematic structural diagram after step S4003 is completed.

In step S4003, a touch insulating layer 82 is formed on a side of the conductive layer away from the second buffer layer 80. The touch insulating layer 82 is located in the island areas S1 and the bridge areas S2. The touch insulating layer 82 has an eighth hollow hole K8 in each opening area S3 and a plurality of third holes 820 located in each island area S1. The boundary of the eighth hollow hole K8 coincides with the boundary of the opening area S3, and the third holes 820 expose a portion of the first conductive bridges 81, as shown in FIG. 16.

Figure 17:
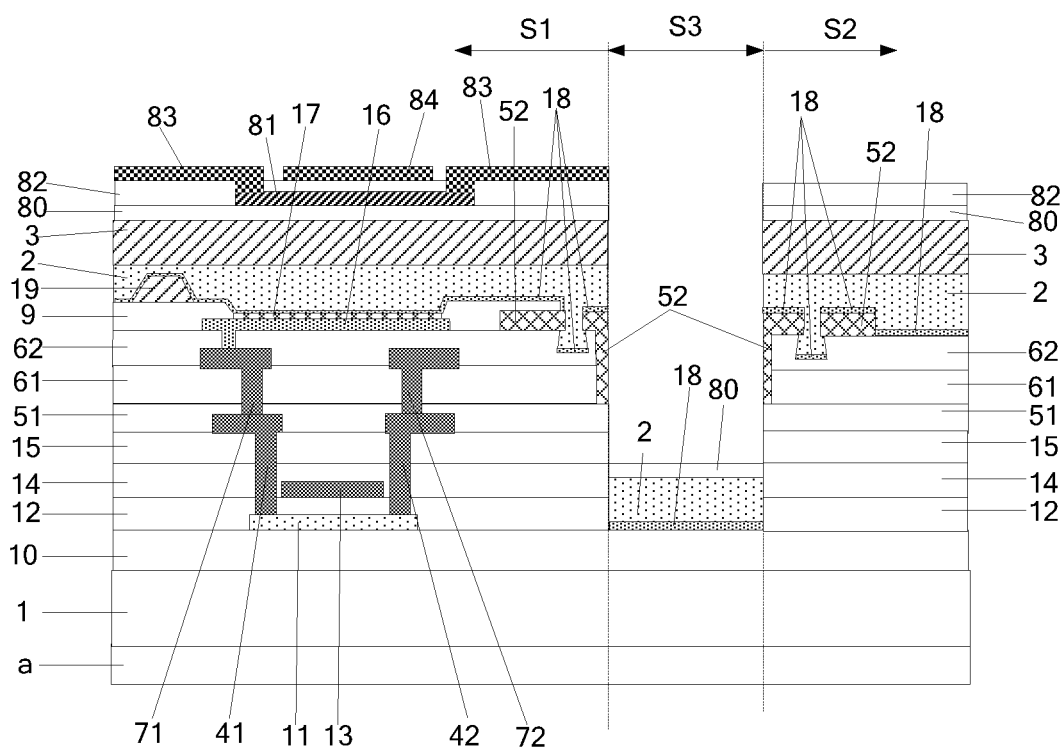
FIG. 17 shows a schematic structural diagram after step S4004 is completed.

In step S4004, a touch electrode layer is formed on a side of the touch insulating layer 82 away from the conductive layer. The touch electrode layer includes a plurality of first touch electrodes 83, second touch electrodes 84, and second conductive bridges 85 at least located in the island areas S1. Each of adjacent first touch electrodes 83 is in contact with the same first conductive bridge 81 through a third hole 820, and adjacent second touch electrodes 84 are in contact with each other through a second conductive bridge 85. The first touch electrodes 83 and the second touch electrodes 84 are insulated from each other, as shown in FIG. 3 and FIG. 17.

Figure 18:
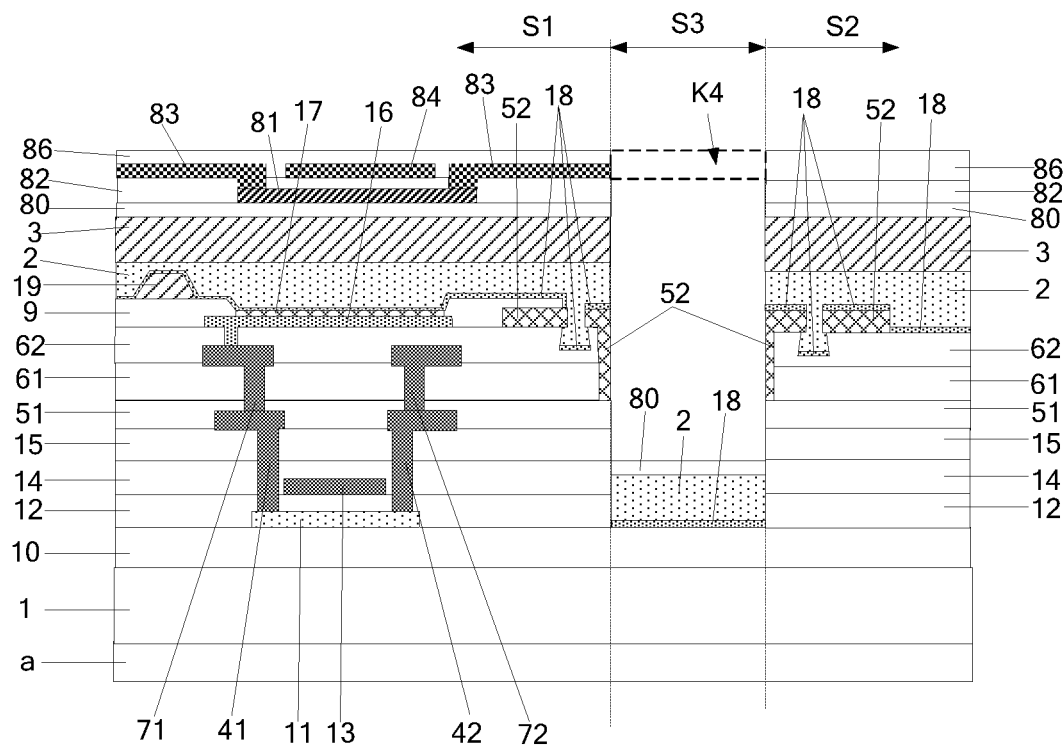
FIG. 18 shows a schematic structural diagram after step S4005 is completed.

In step S4005, an organic protective layer 86 is formed on a side of the touch electrode layer away from the touch insulating layer 82. The organic protective layer 86 is located in the island areas S1 and the bridge areas S2, and the organic protective layer 86 has a fourth hollow hole K4 in each opening area S3. The boundary of the fourth hollow hole K4 coincides with the boundary of the opening area S3, as shown in FIG. 18. It should be noted that the organic protective layer 86 may be an optical adhesive layer, and the fourth hollow hole K4 may be formed by a photolithography process.

Step S500 may include the following steps.

Figure 19:
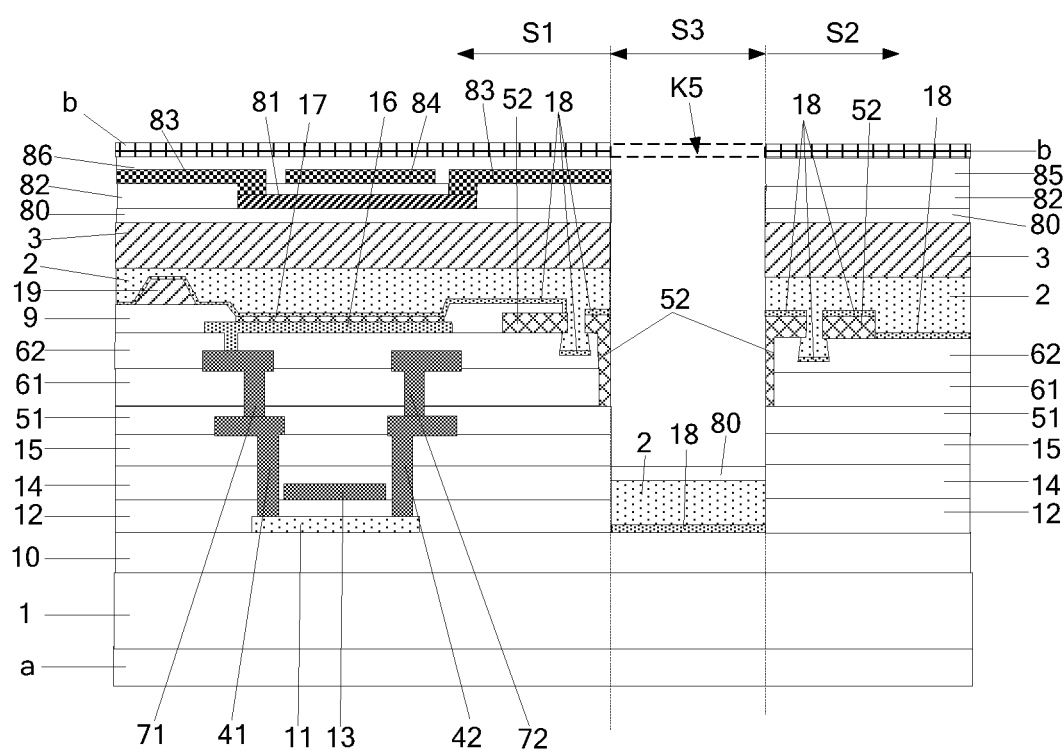
FIG. 19 shows a schematic structural diagram after step S5001 is completed.

In step S5001, a hard mask b is formed on a side of the organic protection layer 86 away from the touch electrode layer. The hard mask b is located in the island areas S1 and the bridge areas S2. The hard mask b has a fifth hollow hole K5 in each opening area S3. The boundary of the fifth hollow hole K5 coincides with the boundary of the opening area S3, as shown in FIG. 19. For example, the material of the hard mask b may be indium zinc oxide; however, embodiments of the present disclosure are not limited to this, and in some other embodiments, the material of the hard mask b may be indium tin oxide or other materials. When the material of the hard mask b is indium zinc oxide, the hard mask b can be patterned by a wet etching process to form the fifth hollow hole K5.

Figure 20:
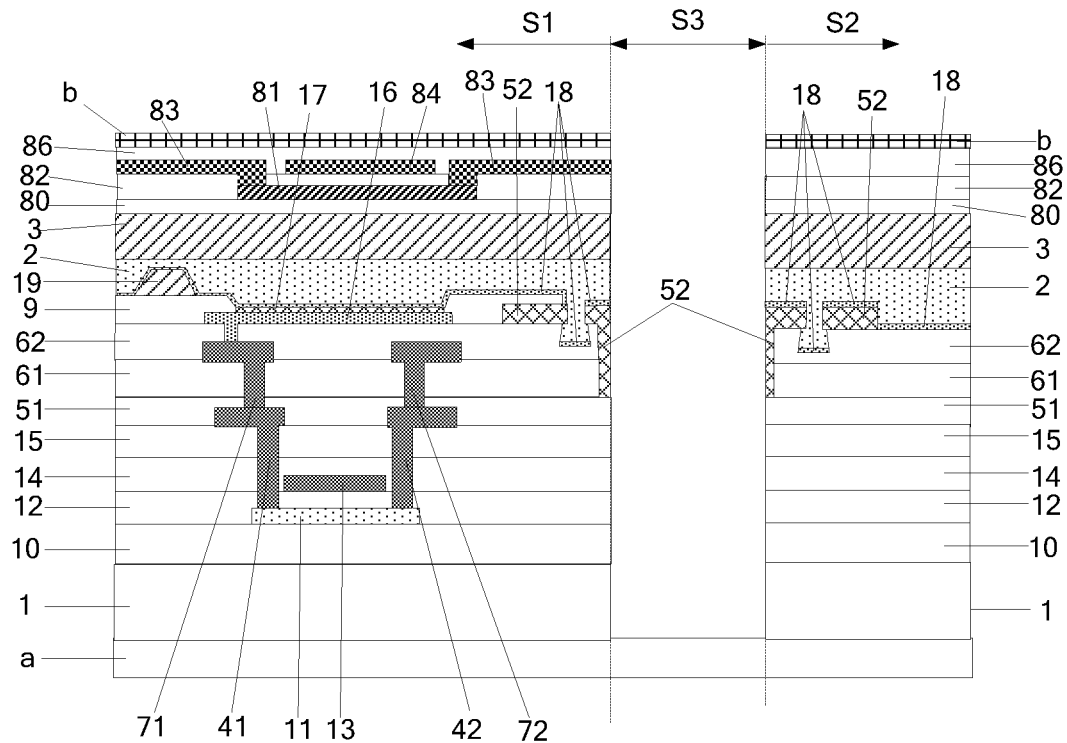
FIG. 20 shows a schematic structural diagram after step S5002 is completed.

In step S5002, a patterning process is used to pattern all the film layers located at the opening area S3 and including at least the second buffer layer 80, the inorganic encapsulation layer 2, the cathode 18, the first buffer layer 10, and the substrate film layer 1 to form the through hole, as shown in FIG. 20. It should be noted that all the layers mentioned here do not include the structure of the carrier glass a.

Figure 21:
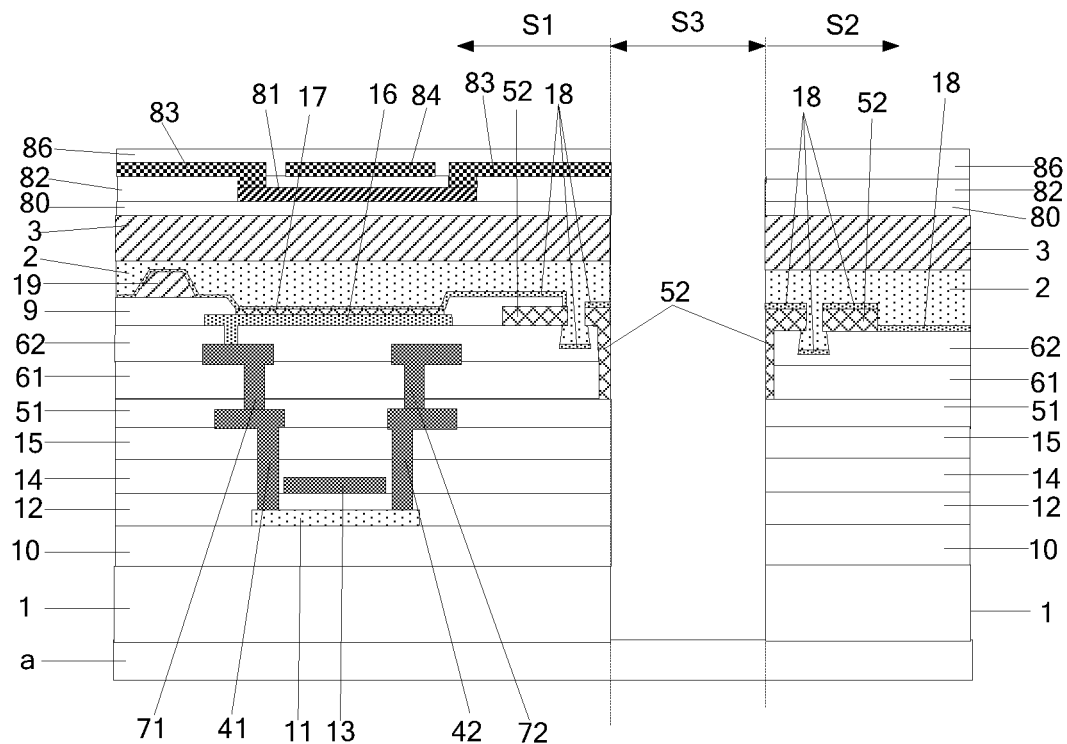
FIG. 21 shows a schematic structural diagram after step S5003 is completed.

In step S5003, the hard mask b on the organic protective layer 86 is removed. For example, the hard mask b can be cleaned by a wet etching method, as shown in FIG. 21. It should be noted that after step S5003, the carrier glass a needs to be removed to form the touch display panel 100 shown in FIG. 2.

Figure 22:
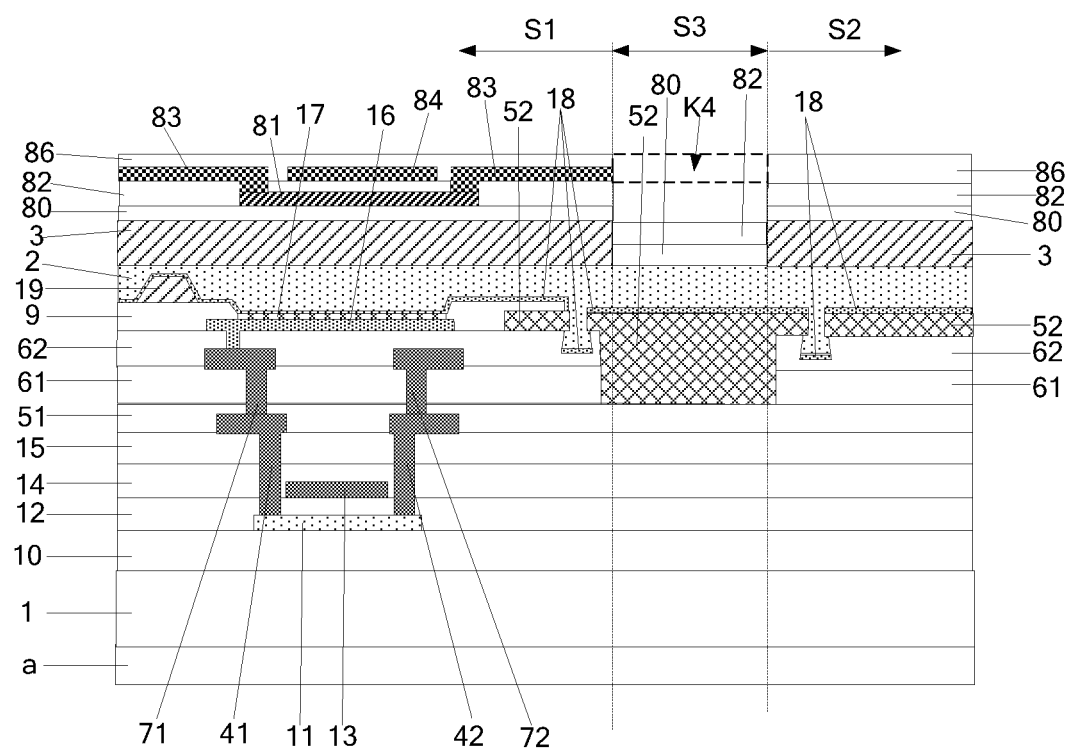
FIG. 22 shows a schematic structural diagram after an organic protective layer is fabricated by another method in an embodiment of the present disclosure.

In another embodiment of the present disclosure, when manufacturing the touch display panel 100, parts of the first gate insulating layer 12, the second gate insulating layer 14, the interlayer dielectric layer 15, the first passivation layer 51, the second passivation layer 52 and the touch insulating layer 82 in the opening area S3 may not be patterned as other areas are patterned (for example, the island area S1). As shown in FIG. 22, after the organic protective layer 86 is formed, the hard mask b can be used to pattern the touch insulating layer 82, the second buffer layer 80, the inorganic encapsulation layer 2, the cathode 18, the second passivation layer 52, the first passivation layer 51, the interlayer dielectric layer 15, the second gate insulating layer 14, the first gate insulating layer 12, the first buffer layer 10 and the substrate film layer 1 as a whole to form the through hole of the touch display panel 100, as shown in FIG. 20. Then, the hard mask b is cleaned by wet etching, as shown in FIG. 21. Finally, the carrier glass a is removed to form the touch display panel 100, shown in FIG. 2.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are only regarded as exemplary, and the true scope and spirit of the present disclosure are defined by the appended claims.

What is claimed is:

1. A method for manufacturing a touch display panel that comprises a plurality of island areas, opening areas located between adjacent ones of the plurality of island areas, and bridge areas for connecting adjacent ones of the plurality of island areas, the method comprising:
   providing a substrate film layer, wherein the substrate film layer is located in the island areas, the opening areas, and the bridge areas;
   forming a display functional film layer on the substrate film layer, wherein the display functional film layer is located at least in the island areas and the bridge areas;
   forming an encapsulation film layer on a side of the display functional film layer away from the substrate film layer, wherein the encapsulation film layer is located at least in the island areas and the bridge areas;
   forming a touch functional film layer on a side of the encapsulation film layer away from the display functional film layer, wherein the touch functional film layer is located at least in the island areas and the bridge areas; and
   after the touch functional film layer is formed, removing all film layers which comprise at least the substrate film layer and are located at the opening areas to form through holes corresponding to the opening areas;
   wherein forming the display functional film layer on the substrate film layer comprises:
      forming a first metal layer on the substrate film layer, the first metal layer comprising at least a source electrode and a drain electrode located in each of the island areas;
      forming a first passivation layer on a side of the first metal layer away from the substrate film layer, wherein the first passivation layer is located in the island areas and the bridge areas, the first passivation layer has a sixth hollow hole located in each opening area, and a boundary of the sixth hollow hole coincides with a boundary of each opening area;
      forming a first planarization layer on a side of the first passivation layer away from the first metal layer, wherein the first planarization layer is located in the island areas and the bridge areas, the first planarization layer has a first hollow hole within which the boundary of the opening area is located, and the first hollow hole exposes the first passivation layer; and
      forming a second passivation layer on a side of the first planarization layer away from the first passivation layer, wherein the second passivation layer is located in the island areas and the bridge areas and is in contact with the first passivation layer through the first hollow hole, the second passivation layer has a seventh hollow hole located in each opening area and whose boundary coincides with a boundary of the opening area, a first hole located in each island areas and close to the opening area and a second hole located in each bridge area and close to the opening area.

2. The manufacturing method according to claim 1, wherein:
   the first passivation layer further has a third through hole and a fourth through hole which are located in the island areas and are provided in a same layer as the sixth hollow hole;
   the first planarization layer further has a fifth through hole and a sixth through hole located in the island areas and provided in a same layer as the first hollow hole, a boundary of the fifth through hole coincides with a boundary of the third through hole, and a boundary of the sixth through hole coincides with a boundary of the fourth through hole;
   wherein after forming the first planarization layer and before forming the second passivation layer, forming the display functional film layer on the substrate film layer further comprises:
   forming a second metal layer on a side of the first planarization layer away from the first passivation layer, wherein the second metal layer comprises a first transfer electrode and a second transfer electrode located in each of the island areas, the first transfer electrode is in contact with the drain electrode through the fifth through hole and the third through hole, and the second transfer electrode is in contact with the source electrode through the sixth through hole and the fourth through hole; and forming a second planarization layer on a side of the second metal layer away from the first planarization layer, wherein the second planarization layer is located in the island areas and the bridge areas, the second planarization layer has a second hollow hole within which a boundary of the opening area is located and a seventh through hole, the second hollow hole is aligned with the first hollow hole, and the seventh through hole exposes a part of the first transfer electrode;

wherein the second passivation layer is in contact with the first passivation layer through the second hollow hole and the first hollow hole.

3. The method according to claim 2, wherein, after forming the seventh hollow hole, the first hole and the second hole on the second passivation layer, forming the display functional film layer on the substrate film layer further comprises:

patterning parts of the second planarization layer corresponding to the first hole and the second hole, so that a first isolation groove communicating with the first hole and a second isolation groove communicating with the second hole are formed in the second planarization layer, wherein a depth of each of the first isolation groove and the second isolation groove is smaller than a thickness of the second planarization layer; and patterning a central part of the second passivation layer that is located at a side of the first hole away from the opening area to form a central hole exposing the second planarization layer.

4. The method according to claim 3, wherein, after the central hole is formed in the second passivation layer, forming the display functional film layer on the substrate film layer further comprises:

forming an anode on the second planarization layer corresponding to the central hole, wherein the anode is in contact with the first transfer electrode through the seventh through hole;

on a side of the anode away from the second planarization layer, forming a pixel define layer in the island areas, wherein the pixel define layer has a pixel opening exposing at least part of the anode, and the pixel define layer covers a part of the second passivation layer between the central hole and the first hole;

on a side of the pixel define layer away from the anode, sequentially forming a spacer and an organic light-emitting layer in the island areas, wherein an orthographic projection of the spacer on the substrate film layer is located in an orthographic projection of the pixel define layer on the substrate film layer, and the organic light-emitting layer is at least located in the pixel opening and in contact with the anode; and forming a cathode on a side of the organic light-emitting layer away from the anode, wherein the cathode is located in the island areas, the bridge areas, and the opening areas, and the cathode is discontinuous at the first isolation groove, the second isolation groove and each opening area.

5. The method according to claim 4, wherein forming the encapsulation film layer on the side of the display functional film layer away from the substrate film layer comprises:

forming an inorganic encapsulation layer on a side of the cathode away from the organic light-emitting layer, wherein the inorganic encapsulation layer is located in the island areas, the bridge areas, and the opening areas, and the inorganic encapsulation layer is filled in the first isolation groove, the first hole, the second isolation groove, and the second hole; and forming an organic encapsulation layer on a side of the inorganic encapsulation layer away from the cathode, wherein the organic encapsulation layer is located in the island areas and the bridge areas, the organic encapsulation layer has a third hollow hole located in each opening area, and a boundary of the third hollow hole coincides with the boundary of the opening area.

6. The method according to claim 5, wherein forming the touch functional film layer on the side of the encapsulation film layer away from the display functional film layer comprises:

forming a second buffer layer on a side of the organic encapsulation layer away from the inorganic encapsulation layer, wherein the second buffer layer is located in the island areas, the bridge areas, and the opening areas;

forming a conductive layer on a side of the second buffer layer away from the organic encapsulation layer, wherein the conductive layer comprise a plurality of first conductive bridges at least located in the island areas;

forming a touch insulating layer on a side of the conductive layer away from the second buffer layer, wherein the touch insulating layer is located in the island areas and the bridge areas, the touch insulating layer has an eighth hollow hole in each opening area and a plurality of third holes located in each island areas, a boundary of the eighth hollow hole coincides with the boundary of the opening area, and the third hole exposes a part of the first conductive bridges;

forming a touch electrode layer on a side of the touch insulating layer away from the conductive layer, wherein the touch electrode layer comprises a plurality of first touch electrodes, second touch electrodes, and second conductive bridges at least located in the island areas, adjacent first touch electrodes are in contact with a same first conductive bridge through one of the third holes, adjacent second touch electrodes are in contact through a corresponding second conductive bridge, and the first touch electrodes and the second touch electrodes are insulated from each other; and forming an organic protective layer on a side of the touch electrode layer away from the touch insulating layer, wherein the organic protective layer is located in the island areas and the bridge areas, and the organic protective layer has a fourth hollow hole located in each opening area, and a boundary of the fourth hollow hole coincides with the boundary of the opening area.

7. The method according to claim 6, wherein the organic encapsulation layer and the organic protective layer are optical adhesive layers.

8. The method according to claim 7, wherein a material of the hard mask is indium zinc oxide.

9. The method according to claim 6, wherein after the touch functional film layer is formed, removing all film layers which comprise at least the substrate film layer and are located at the opening area to form the through holes corresponding to the opening areas, comprises:

forming a hard mask on a side of the organic protective layer away from the touch electrode layer, wherein the hard mask is located in the island areas and the bridge areas, the hard mask has a fifth hollow hole located in each opening area, and a boundary of the fifth hollow hole coincides with the boundary of the opening area;

patterning all the film layers which comprise at least the second buffer layer, the inorganic the inorganic encapsulation layer, the cathode, and the substrate film layer and are located at the opening areas by using a patterning process to form the through holes; and removing the hard mask on the organic protective layer.

10. The method according to claim 1, wherein before the first metal layer is formed on the substrate film layer, forming the display functional layer on the substrate film layer further comprises:

forming a first buffer layer on the substrate film layer, wherein the first buffer layer is located in the island areas, the bridge areas, and the opening areas;

forming an active layer on a side of the first buffer layer away from the substrate film layer, wherein the active layer is located in the island areas;

forming a first gate insulating layer on a side of the active layer away from the first buffer layer, wherein the first gate insulating layer is located in the island areas, the bridge areas, and the opening areas;

forming a third metal layer on a side of the first gate insulating layer away from the active layer, wherein the third metal layer at least comprises a gate electrode located in each of the island areas;

forming a second gate insulating layer on a side of the third metal layer away from the first gate insulating layer, wherein the second gate insulating layer is located in the island areas, the bridge areas, and the opening areas;

forming an interlayer dielectric layer on a side of the second gate insulating layer away from the third metal layer, wherein the interlayer dielectric layer is located in the island areas, the bridge areas, and the opening areas; and patterning the interlayer dielectric layer, the second gate insulating layer, and the first gate insulating layer to form the first through hole and the second through hole located in the island areas and a ninth hollow hole located in each opening area, wherein the first through hole exposes one end of the active layer, the second through hole exposes the other end of the active layer, and a boundary of the ninth hollow hole coincides with the boundary of the opening area and the ninth hollow hole exposes the first buffer layer;

wherein the drain electrode is in contact with one end of the active layer through the first through hole, and the source electrode is in contact with the other end of the active layer through the second through hole.

11. A touch display panel that comprises a plurality of island areas, opening areas located between adjacent ones of the plurality of island areas, and bridge areas for connecting adjacent ones of the plurality of island areas, the touch panel further comprising:

a substrate film layer;

a display functional film layer formed on the substrate film layer, wherein the display functional film layer is located at least in the island areas and the bridge areas;

an encapsulation film layer formed on a side of the display functional film layer away from the substrate film layer, wherein the encapsulation film layer being located at least in the island areas and the bridge areas;

a touch functional film layer formed on a side of the encapsulation film layer away from the display functional film layer, wherein the touch functional film layer is located at least in the island areas and the bridge areas;

wherein all film layers which comprise at least the substrate film layer and are located at opening areas of the display panel are removed after the touch functional film layer is formed to form through holes corresponding to the opening areas;

wherein the display functional film layer comprises:

a first metal layer on the substrate film layer, wherein the first metal layer comprises at least a source electrode and a drain electrode located in each of the island areas;

a first passivation layer on a side of the first metal layer away from the substrate film layer, wherein the first passivation layer is located in the island areas and the bridge areas, the first passivation layer has a sixth hollow hole located in each opening area, and a boundary of the sixth hollow hole coincides with a boundary of each opening area;

a first planarization layer on a side of the first passivation layer away from the first metal layer, wherein the first planarization layer is located in the island areas and the bridge areas, the first planarization layer has a first hollow hole within which the boundary of the opening area is located, and the first hollow hole exposes the first passivation layer; and a second passivation layer on a side of the first planarization layer away from the first passivation layer, wherein the second passivation layer is located in the island areas and the bridge areas and is in contact with the first passivation layer through the first hollow hole, the second passivation layer has a seventh hollow hole located in each opening area and whose boundary coincides with a boundary of the opening area, a first hole located in each island areas and close to the opening area and a second hole located in each bridge area and close to the opening area.

12. A touch display device, comprising:

a cover plate; and a touch display panel, wherein the touch display panel comprises a plurality of island areas, opening areas located between adjacent ones of the plurality of island areas, and bridge areas for connecting adjacent ones of the plurality of island areas, and further comprises:

a substrate film layer;

a display functional film layer formed on the substrate film layer, wherein the display functional film layer is located at least in the island areas and the bridge areas;

an encapsulation film layer formed on a side of the display functional film layer away from the substrate film layer, wherein the encapsulation film layer being located at least in the island areas and the bridge areas; and a touch functional film layer formed on a side of the encapsulation film layer away from the display functional film layer, wherein the touch functional film layer is located at least in the island areas and the bridge areas;

wherein all film layers which comprise at least the substrate film layer and are located at opening areas of the display panel are removed after the touch functional film layer is formed to form through holes corresponding to the opening areas;

wherein a side of the touch functional film layer of the touch display panel away from the substrate film layer is attached to the cover plate;

wherein the display functional film layer comprises:

a first metal layer on the substrate film layer, wherein the first metal layer comprises at least a source electrode and a drain electrode located in each of the island areas;

a first passivation layer on a side of the first metal layer away from the substrate film layer, wherein the first passivation layer is located in the island areas and the bridge areas, the first passivation layer has a sixth hollow hole located in each opening area, and a boundary of the sixth hollow hole coincides with a boundary of each opening area;

a first planarization layer on a side of the first passivation layer away from the first metal layer, wherein the first planarization layer is located in the island areas and the bridge areas, the first planarization layer has a first hollow hole within which the boundary of the opening area is located, and the first hollow hole exposes the first passivation layer; and a second passivation layer on a side of the first planarization layer away from the first passivation layer, wherein the second passivation layer is located in the island areas and the bridge areas and is in contact with the first passivation layer through the first hollow hole, the second passivation layer has a seventh hollow hole located in each opening area and whose boundary coincides with a boundary of the opening area, a first hole located in each island areas and close to the opening area and a second hole located in each bridge area and close to the opening area.

* * * * *